(12) United States Patent
Solak et al.

(10) Patent No.: US 8,525,973 B2
(45) Date of Patent: Sep. 3, 2013

(54) METHOD AND APPARATUS FOR PRINTING PERIODIC PATTERNS

(75) Inventors: Harun H. Solak, Brugg (CH); Francis S. M. Clube, Hausen (CH); Christian Dais, Turgi (CH)

(73) Assignee: Eulitha A.G., Villigen (CH)

( * ) Notice: Subject to any disclaimer, the term of this patent is extended or adjusted under 35 U.S.C. 154(b) by 274 days.

(21) Appl. No.: 13/035,012

(22) Filed: Feb. 25, 2011

(65) Prior Publication Data

US 2012/0092635 A1 Apr. 19, 2012

Related U.S. Application Data

(63) Continuation-in-part of application No. 12/903,389, filed on Oct. 13, 2010.

(51) Int. Cl.
*G03B 27/52* (2006.01)
*G03B 27/68* (2006.01)

(52) U.S. Cl.
USPC .................. 355/77; 355/52; 355/67; 378/34

(58) Field of Classification Search
USPC ................................ 355/52, 77, 67; 378/34
See application file for complete search history.

(56) References Cited

U.S. PATENT DOCUMENTS

| | | | |
|---|---|---|---|
| 7,898,646 B2 * | 3/2011 | Noordman et al. | 355/48 |
| 8,368,871 B2 * | 2/2013 | Solak et al. | 355/77 |
| 2008/0186579 A1 * | 8/2008 | Solak | 359/577 |
| 2011/0199598 A1 * | 8/2011 | Solak et al. | 355/67 |
| 2011/0310374 A1 * | 12/2011 | Solak et al. | 355/67 |
| 2012/0009525 A1 * | 1/2012 | Clube et al. | 430/322 |
| 2012/0092634 A1 * | 4/2012 | Solak et al. | 355/67 |
| 2012/0092635 A1 * | 4/2012 | Solak et al. | 355/67 |

OTHER PUBLICATIONS

Zanke et al.,"Large area patterning for photonic crystals via coherent diffraction lithography", J. Vac. Sci. Technol B. 22 (2004), pp. 3352-3355.

Solak et al., Achromatic Spatial frequency Multiplication: A Method for Production of Nanometer-scaie periodic structures J. Vac. Sci. Technol. 23 (2005), pp. 2705-2710.

* cited by examiner

*Primary Examiner* — Thomas R Artman
(74) *Attorney, Agent, or Firm* — Pauley Peterson & Erickson

(57) ABSTRACT

A method for printing a pattern of features including the steps of providing a substrate having a recording layer disposed thereon, providing a mask bearing a periodic pattern of features, arranging the substrate parallel to the mask and with a separation having an initial value, providing an illumination system for illuminating the mask with an intensity of monochromatic light to generate a transmitted light-field for exposing the recording layer, and illuminating the mask for an exposure time while changing the separation by a distance having a desired value and with a rate of change of separation, wherein at least one of the rate of change of separation and the intensity of light are varied during the change of separation, whereby the mask is illuminated by an energy density per incremental change of separation that varies over said distance.

19 Claims, 13 Drawing Sheets

METHOD AND APPARATUS FOR PRINTING PERIODIC PATTERNS

CROSS-REFERENCE TO RELATED APPLICATIONS

This application is a Continuation-in-part of Ser. No. 12/903,389, filed Oct. 13, 2010 by the present inventors, which is incorporated by reference.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION BY REFERENCE OF MATERIAL SUBMITTED ON A COMPACT DISC

Not Applicable

BACKGROUND TO THE INVENTION

1. Field of the Invention

This invention relates generally to the field of photolithography as employed for the fabrication of micro- and nano-structures, and it relates particularly to the field of photolithography based on the Talbot effect.

2. Description of Related Art

Lithographic fabrication enables the formation of micro- and nano-patterns on surfaces. Photolithographic techniques achieve this by exposing a photosensitive surface to a light-field with an intensity distribution corresponding to the desired pattern. The photosensitive surface is usually a thin layer of a sensitive material, such as photoresist, which is coated either directly on a substrate surface or indirectly over intermediate layers of other materials. Chemical or physical changes that occur in the photosensitive layer as a result of the exposure are used in subsequent processes to obtain a desired pattern in the material of the substrate or in an intermediate layer of another material. In the most commonly used photolithographic technique an image of a pattern defined in a mask is projected onto the substrate surface using an optical system.

For many applications patterns are required that comprise a unit cell of pattern features that repeat in one or two dimensions, that is, periodic patterns. A specialized photolithographic technique for transferring such patterns from masks onto substrates is based on the Talbot effect. When a periodic pattern defined in a mask is illuminated with a collimated beam of monochromatic light, diffraction orders in the transmitted light-field reconstruct "self-images" of the pattern at regular distances from the mask in so-called Talbot planes. For linear gratings the separation of the self-images, S, which is known as the Talbot distance, is related to the illumination wavelength, $\lambda$, and period of the pattern, p, by $$S \approx 2p^2/\lambda \qquad \text{equ. (1)}$$

Whereas, this formula has good accuracy when $p \gg \lambda$ (i.e. when the light is diffracted at relatively small angles), it approximates less well as the magnitude of p approaches $\lambda$. Locating a photoresist-coated substrate at one of these planes results in the mask pattern being printed into the photoresist (see, for example, C. Zanke, et al., "Large area patterning for photonic crystals via coherent diffraction lithography", J. Vac. Sci. Technol. B 22, 3352 (2004)). Furthermore, at intermediate distances between the self-image planes, Talbot sub-images are formed that have higher spatial frequencies than the pattern in the mask, which may be printed by placing a photoresist-coated substrate at one of these fractional Talbot planes. The printed results achieved using these techniques are improved when the duty cycle of the mask pattern (i.e. the dimension of the features as a fraction of the feature period) is selected to produce a high contrast of intensity distribution in the Talbot or fractional Talbot plane (see U.S. Pat. No. 4,360, 586). It is also known in the prior art that the contrast of the Talbot images can be further enhanced by fabricating the periodic patterns in the mask using phase shifting materials. Photolithography using Talbot imaging is especially advantageous for printing high-resolution periodic patterns in view of the high cost of conventional, projection-type photolithographic systems for such patterns.

A major shortcoming of the Talbot technique, however, is that the intensity distributions of the self-images and sub-images are very sensitive to the distance from the mask, that is, they have a very narrow depth of field. This means that the substrate needs to be positioned very accurately with respect to the mask in order to correctly print the grating. This becomes increasingly more difficult as the grating period is reduced because the depths of field of the self-images and sub-images depend on the square of the pattern period. Furthermore, if the pattern needs to be printed onto a substrate surface that is not very flat or if there are topographical structures on its surface, or the pattern needs to be printed into a thick layer of photoresist, it may be impossible to achieve the desired result.

Achromatic Talbot lithography has recently been introduced as an improved method for printing high-resolution periodic patterns in a cost effective way (see H. H. Solak, et al., "Achromatic Spatial Frequency Multiplication: A Method for Production of Nanometer-Scale Periodic Structures", J. Vac. Sci. Technol., 23, pp. 2705-2710 (2005), and U.S. Pat. Appl. no. 2008/0186579). It offers two significant advantages for lithographic applications: firstly, it overcomes the depth-of-field problem encountered using the classical Talbot method; and, secondly, for many pattern types it performs a spatial-frequency multiplication, that is, it increases the resolution of the printed features with respect to that of the pattern in the mask. In achromatic Talbot lithography (ATL) the mask is illuminated with a collimated beam from a light source with a broad spectral bandwidth, and beyond a certain distance from the mask the transmitted light-field forms a so-called stationary image whose intensity distribution is invariant to further increase in distance. In the case of a linear grating, the minimum distance, $d_{min}$, from the mask at which this occurs is related to the period of the pattern, p, in the mask and to the spectral bandwidth of the illumination, $\Delta\lambda$, by:

$$d_{min} \approx 2p^2/\Delta\lambda \qquad \text{equ. (2)}$$

Beyond this distance, the Talbot image planes for the different wavelengths are distributed in a continuous manner with increasing distance from the mask, which generates the stationary image. Thus, by placing a photoresist-coated substrate in this region exposes the substrate to the entire range of transverse intensity distributions formed between successive Talbot planes for a particular wavelength. The pattern printed onto the substrate is therefore an average, or integration, of this range of transversal intensity distributions, which is substantially insensitive to longitudinal displacement of the substrate with respect to the mask. The technique therefore enables a much larger depth of field than with standard Talbot imaging, and a much larger depth of field than with conventional projection, proximity or contact printing.

The intensity distribution in an ATL image from a particular mask pattern may be determined using modelling software that simulates the propagation of electromagnetic waves through and after the mask. Such simulation tools may be used to optimize the design of the pattern in the mask for obtaining a particular printed pattern at the substrate surface.

The ATL method has been developed primarily to print periodic patterns that comprise a unit cell that repeats with a constant period in at least one direction. The technique may, however, also be successfully applied to patterns whose period spatially varies in a sufficiently "slow", gradual way across the mask such that the diffraction orders that form a particular part of the stationary image are generated by a part of the mask in which the period is substantially constant. Such patterns may be described as being quasi-periodic.

A drawback of ATL is that it requires a light source with a significant spectral bandwidth in order that the separation required between the mask and substrate is not disadvantageously large. The angular divergence of the different diffracted orders propagating from the mask produces spatial offsets between the different orders at the substrate surface resulting in imperfect image reconstruction at the pattern edges, which becomes worse with increasing separation. Fresnel diffraction at the edges of the diffracted orders also degrades the edges of the printed pattern, and this likewise gets worse with increasing separation. For these reasons laser sources, which have relatively small spectral bandwidth, are in most cases unsuitable for ATL.

A difficulty with applying non-laser sources such as arc lamps or light emitting diodes to ATL is obtaining the combination of high power in the exposure beam for ensuring high throughput in a production process, and good beam collimation for ensuring high-contrast imaging and minimizing loss of feature resolution. Obtaining good collimation from non-laser sources requires spatial filtering of the output beam which generally results in a large loss of power.

The advantages of the ATL technique may be obtained using a different but related technique that is disclosed in U.S. Pat. Appl. no. 2008/0186579. In this scheme, the periodic pattern in the mask is illuminated by a collimated beam of monochromatic light and during exposure the distance of the substrate from the mask is varied over a range corresponding to an integer multiple of the separation between successive Talbot image planes in order that an average of the intensity distributions between Talbot planes is printed on the substrate. The smallest displacement that may be employed is therefore equal to the separation of successive Talbot planes (when integer=1). With this displacement during exposure, the pattern printed on the substrate is substantially the same as that printed using the ATL technique. It is disclosed that the displacement may be performed either continuously or in a discrete way by exposing the substrate at multiple discrete positions over the range. Using the continuous displacement, the speed of displacement is necessarily constant in order that the desired average of the transversal intensity distributions is obtained, and using the discrete, or stepped, displacement, the exposure dose at each discrete position should necessarily be the same for the same reason. The general technique may be referred to as displacement Talbot lithography (DTL)

Whereas the integrated intensity distributions generated at the substrate using the ATL and DTL techniques are essentially equivalent, and both enable a large depth of field and spatial-frequency multiplication for the printed pattern, the DTL scheme has the advantage that it can be used with much smaller separations of the substrate and mask. This reduces the degradation of the pattern edges and allows more efficient utilization of the output from the light source because of the less stringent requirement on collimation. Further, the DTL technique enables the use of laser sources, which may be preferred for production processes. The light from such sources can be formed into well-collimated beams with negligible loss of power, so minimize loss of feature resolution and maximize image contrast.

The structure of the patterns printed using DTL from a particular mask pattern may also be theoretically determined using simulation software.

The prior art further mentions that DTL, like ATL, may be applied to quasi-periodic patterns, though the details, limitations and disadvantages of this are not disclosed.

A drawback of the DTL technique is that the longitudinal displacement of the substrate relative to the mask during exposure has to correspond accurately to an integer multiple of the Talbot distance. When the displacement is exactly an integer multiple, the integrated intensity distribution exposing the substrate is independent of the initial separation of the substrate and mask, and so produces a uniform exposure of the pattern features on the substrate even if the mask and substrate are not accurately flat and parallel. If, on the other hand, the displacement is not an exact integer multiple of the Talbot distance because of, for example, mechanical hysteresis or limited stepping resolution of a displacement actuator, or because of inexact synchronization between the duration of the exposure by the illumination system and the displacement of the substrate, then the integrated intensity distribution depends on the initial separation. In this case, if the mask and substrate are not accurately flat and parallel, then a spatial variation of feature size is introduced into the printed pattern; or, if the mask and substrate are accurately flat and parallel but their separation is different for different substrates, then the size of the printed features varies from substrate to substrate; both of which may be problems for certain applications. These sensitivities of the printed feature size to the separation of the mask and substrate may be reduced by longitudinally displacing the substrate by a large number of Talbot distances relative to the mask, but this can introduce other problems such as degradation of the feature resolution (if the illumination beam is not well collimated), distortion of the feature shape (if the direction of displacement is not accurately longitudinal), degradation of the pattern edges (if the gap becomes too large), and disadvantageously requires a larger travel range in the mechanical system.

A further difficulty in arranging that the longitudinal displacement corresponds accurately to an integer multiple of the Talbot distance is that in the general case the transmitted light-field is not exactly periodic in the direction orthogonal to the mask, as is explained for two particular examples of one-dimensional and two-dimensional patterns below. In the case of a one-dimensional periodic pattern, i.e. a linear grating, if the grating period in relation to the illumination wavelength is such that only $0^{th}$ and $1^{st}$ diffraction orders propagate in the transmitted light-field, then the resultant interference pattern is exactly periodic in the direction orthogonal to the mask (neglecting effects at the edges of the mask pattern), and the self-image planes are well defined and separated by an exact Talbot distance. If, however, the period of the grating in relation to the wavelength is such that $2^{nd}$ and possibly higher diffraction orders also propagate, then the phases of the higher orders at the self-image planes (as defined by the $0^{th}$ and $1^{st}$ orders) are not exactly the same as in the plane of the mask, and so self-images are not accurately formed and the transmitted light-field is not exactly periodic in the direction orthogonal to the mask. With higher diffraction orders it is therefore not possible with the prior-art teaching of DTL to avoid some dependence of the integrated intensity distribution on the initial value of the separation between the substrate and mask, which makes it difficult to print a pattern uniformly and reproducibly. In the case of two-dimensional periodic patterns, there are further difficulties in obtaining an exactly periodic light-field in the direction orthogonal to the mask. For example, if the periods of the pattern components in orthogonal directions are different, then the Talbot distances relating to the respective components are also different, and so in the general case the transmitted light-field cannot be periodic with either Talbot distance in the direction of propagation. In a further example, if the pattern features are arranged on a square grid (so that the periods of the pattern components in the two directions are the same) and the pattern period is selected so that only 1st diffraction orders propagate (including ($\pm 1$, $\pm 1$) diagonally diffracted orders) in the transmitted light-field, then the different Talbot distance associated with the diagonally diffracted orders also degrades the periodicity of the light-field in the direction orthogonal to the mask.

Yet another difficulty with the prior art teaching of displacement Talbot lithography is its application to quasi-periodic patterns whose period is not uniform but varies slowly over the pattern area or to mask patterns containing a plurality of discrete grating periods. With such patterns, it is not possible to illuminate the complete pattern and displace the substrate relative to the mask by an exact integer multiple of the Talbot distance that simultaneously satisfies the different periods; and therefore, for reasons explained earlier, it is not possible to print such patterns uniformly.

It is therefore a first object of the present invention to provide a method and apparatus related to displacement Talbot lithography for printing a periodic pattern of features uniformly and reproducibly onto a substrate from a pattern in a mask without requiring the substrate to be displaced relative to the mask by a distance that corresponds accurately to an integer multiple of the Talbot distance.

It is a second object of the present invention to provide a method and apparatus related to displacement Talbot lithography for printing a periodic pattern of features uniformly and reproducibly onto a substrate from a pattern in a mask that does not require a relative displacement of the substrate with respect to the mask that is greater than the Talbot distance by a large factor in order not to degrade unacceptably any of the resolution of the printed features, the shapes of the printed features, and the definition of the pattern edges.

It is a third object of the present invention to provide a method and apparatus related to displacement Talbot lithography for printing a one-dimensional periodic pattern of features uniformly and reproducibly onto a substrate from a one-dimensional mask pattern whose period in relation to the wavelength of illumination is such that $2^{nd}$ or higher diffraction orders are generated in the light-field transmitted by the mask.

It is a fourth object of the present invention to provide a method and apparatus related to displacement Talbot lithography for printing a two-dimensional periodic pattern of features uniformly and reproducibly onto a substrate from a two-dimensional mask pattern whose periods in the different directions are not the same or which generates diagonally diffracted orders.

It is a fifth object of the present invention to provide a method and apparatus related to displacement Talbot lithography for printing a periodic pattern of features uniformly and reproducibly onto a substrate from a mask pattern whose period varies either continuously or step-wise across the mask.

It is a sixth object of the present invention to provide a method and apparatus related to displacement Talbot lithography for printing a periodic pattern of features uniformly and reproducibly onto a substrate from a mask pattern that does not require an exact synchronization between the exposure by the illumination system and the displacement of the substrate or mask.

SUMMARY OF THE INVENTION

According to a first aspect of the present invention, a method is provided for printing at least one of a first periodic pattern of features and a first quasi-periodic pattern of features, which includes the steps of:

a) providing a substrate having a recording layer disposed thereon;

b) providing a mask bearing at least one of a second periodic pattern of features and a second quasi-periodic pattern of features;

c) arranging the substrate substantially parallel to the mask and with a separation having an initial value;

d) providing an illumination system for illuminating the mask with an intensity of substantially monochromatic light to generate a transmitted light-field for exposing the recording layer; and e) illuminating the mask for an exposure time whilst changing the separation by a distance having a desired value and with a rate of change of separation wherein at least one of the with a rate of change of separation and the intensity of light is varied during the change of separation so that the mask is illuminated by an energy density per incremental change of separation that varies over said distance;

whereby the pattern printed in the recording layer has low sensitivities to a deviation of the distance from the desired value and to the initial value of the separation.

Preferably, the exposure density per incremental change of separation should vary by at least 50% over the displacement distance, and most preferably should vary by at least 80%.

Most preferably, the full width at half maximum (FWHM) of the profile describing the variation of the exposure energy density per incremental change of separation over the displacement distance should be at least 0.8 times the Talbot distance, though smaller values, down to half the Talbot distance, may be alternatively used with the consequence of less uniform and less reproducible results. Most preferably also, the full width of the profile should be at least 0.8 times twice the Talbot distance though likewise smaller values, down to the Talbot distance, may be alternatively used to satisfy less demanding applications.

Advantageously, the variation of energy density per incremental change of separation over the distance corresponds substantially to one of a truncated Gaussian distribution, a truncated sinusoidal distribution and a triangular distribution, although a distribution that is similar to at least one of said distributions may be alternatively employed.

Advantageously, the separation of the mask and wafer is changed in a continuous manner over the displacement distance, although it may alternatively be changed in a discrete manner by changing the separation in a series of smaller steps over the distance, wherein the separation remains constant for a period of time after each step.

Advantageously, the separation may be changed a plurality of times over the distance during the complete exposure, wherein at least one of the rate of change of separation and the intensity of illumination are varied during each of said changes of separation.

According to a second aspect of the present invention, an apparatus is provided for printing at least one of a first periodic pattern of features and a first quasi-periodic pattern of features, which includes:

a) a substrate having a recording layer disposed thereon;
b) a mask bearing at least one of a second periodic pattern of features and a second quasi-periodic pattern of features;
c) a means for arranging the substrate substantially parallel to the mask and with a separation having an initial value;
d) an illumination system for illuminating the mask with an intensity of substantially monochromatic light to generate a transmitted light-field for exposing the recording layer;
e) a means for changing the separation over a distance having a desired value and with a with a rate of change of separation during the illumination of the mask; and
f) a means for varying at least one of the with a rate of change of separation and the intensity of light so that the mask is illuminated by an energy density per incremental change of separation that varies over the distance;
whereby the pattern printed in the recording layer has low sensitivities to a deviation of the distance from the desired value and to the initial value of the separation.

Preferably, the varying means either displaces an actuator with a variable speed or modulates the intensity of the light illuminating the mask.

In the latter case, the varying means advantageously comprises a variable attenuator included in the path of the illumination beam between the light source of the illumination system and the mask that modulates, most preferably under computer control, the intensity of the beam illuminating the mask. Alternatively, the intensity varying means modulates, most preferably under computer control, the electrical input to the light source such that the power of its output beam is varied.

Preferably, the features of the pattern in the mask comprise transparent spaces in a layer of an opaque material, such as chrome, formed on a transparent substrate. Alternatively, they may comprise transparent spaces in a layer of a transparent or partially transparent material that introduces a relative phase shift into the locally transmitted light, formed on a transparent substrate.

The periodic pattern or patterns in the mask and the printed pattern or patterns may either be one-dimensional patterns (i.e. linear gratings), or two-dimensional patterns (with features arranged on, for example, square, rectangular or hexagonal grids), or a mixture of one-dimensional and two-dimensional periodic patterns. In the case that there is a plurality of periodic patterns in the mask, the patterns may have the same period or may have different periods, and their grating vectors may be in the same direction or may be in different directions.

Advantageously, the illumination system generates an illumination beam that is uniform and which is stationary with respect to the mask during the exposure. Alternatively, the illumination system can scan a beam across the mask so that the time-integrated exposure density is uniform across the pattern. In this case the variation of energy density per incremental change of separation over the distance should be repeated with a sufficiently high frequency during the exposure such that each point of the mask pattern receives the same variation of energy density per incremental change of separation over the distance.

BRIEF DESCRIPTION OF THE SEVERAL VIEWS OF THE DRAWINGS

The above and/or other aspects of the present invention will become apparent and more readily appreciated from some exemplary embodiments described below, taken in conjunction with the accompanying drawings, in which.

DETAILED DESCRIPTION OF THE INVENTION

Figure 1:
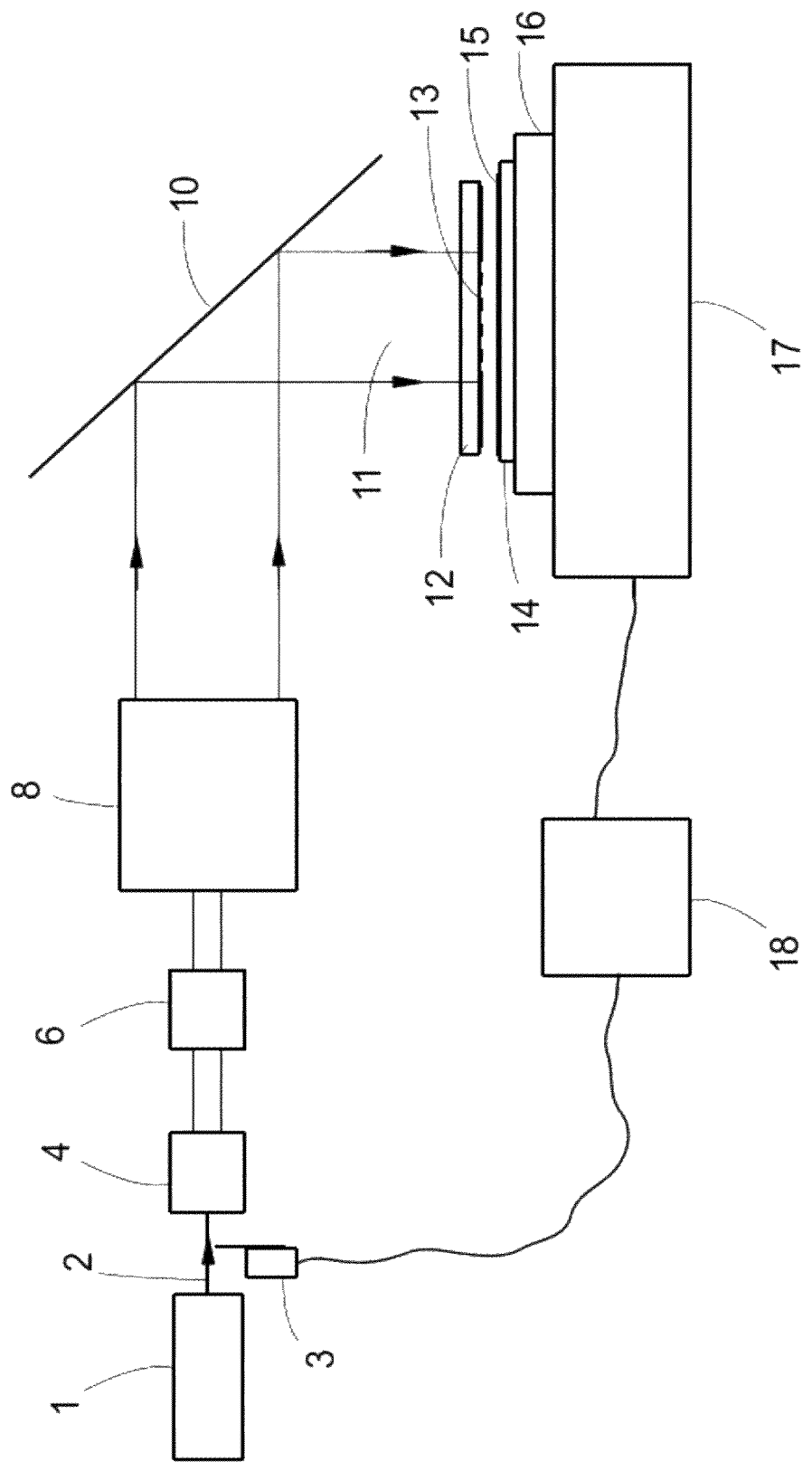
FIG. 1 is a schematic representation of a first embodiment of the invention for printing a periodic pattern onto a wafer in which the speed of longitudinal displacement of the wafer with respect to a mask is varied during the illumination of the mask.

With reference to FIG. 1, which shows a first exemplary embodiment of the invention, an argon-ion laser 1 emits a beam of substantially monochromatic light 2 with a wavelength 363.8 nm and a diameter ~2 mm, which is in single transverse mode (so has a Gaussian intensity profile) and multiple longitudinal mode. The light is plane-polarized, the polarization vector being orthogonal to the plane of the diagram. Such a laser may be obtained from, for example, Newport Corporation (in particular, their range of BeamLok lasers) or from Coherent Inc. (in particular, their range of Innova Sabre lasers). After passing through an electronically operated shutter 3 the diameter of the beam 2 is enlarged by a beam expander 4, which comprises a pair of lenses, so that the intensity profile of the resultant beam may be more easily converted, using a beam-transformer 6, from a Gaussian distribution into one that is substantially uniform across the central part of the beam. Suitable beam transformers are commercially available from, for example, Moltech GmbH (in particular, their piShaper product range). The output beam of the beam transformer 6 passes through a second beam-expander 8 that forms a collimated beam whose central, uniform part has a diameter larger than the size of the pattern to be printed. This beam is reflected by a mirror 10 to a mask 12 so that a pattern 13 in the mask 12 is illuminated substantially uniformly by the collimated beam 11 at normal incidence. On the underside surface of the mask is a one-dimensional periodic pattern 13 (i.e. a linear grating) with a period of 800 nm composed of opaque lines and transparent spaces. The pattern 13 has been fabricated in a layer of chrome on a thick (e.g. 0.25") fused silica substrate using standard electron-beam mask manufacturing technology. Whereas the figure only shows five lines and spaces in the mask pattern 13, it should be understood that many orders of magnitude more lines may be present and that the mask pattern 13 typically has dimensions measured in centimeters. The mask 12 is rigidly mounted to a support frame (not shown in the diagram).

Below the mask 12 is a wafer 14 that has been spin-coated on its upper surface with a ~1 µm-thick layer of a standard i-line sensitive photoresist 15. The wafer 14 is mounted to a vacuum chuck 16 that is attached to a mechanical positioning system 17 incorporating actuators configured for positioning the wafer 14 substantially parallel and in proximity to the pattern 13 in the mask 12. The actuators are displaced using the control system 18. The actuators preferably comprise three piezo-electric transducers (PZTs) each having an integrated strain gauge or capacitive sensor to enable closed-loop control of their respective displacements in order to minimize displacement errors caused by hysteresis and drifts, and preferably have a long travel range, such as 100 µm. Using, for example, reference spacers of known and equal thickness that are introduced on different sides of the wafer 14, the wafer 14 is adjusted parallel to the mask 12 and in proximity to the mask 12. The separation between the wafer 14 and mask 12 may be typically initially set to a value of 20 µm. As for displacement Talbot lithography, this parameter is not critical though should be small enough so that the range of angles in the illuminating beam due to non-perfect local collimation do not unacceptably degrade the resolution of the printed pattern. The positioning system 17 should most preferably also incorporate guides or an equivalent mechanism (as would be well-known to an engineer skilled in the art of standard precision positioning systems) in order that the longitudinal displacement of the wafer 14 that is required during the exposure operation is accurately orthogonal to the wafer 14 surface, to the extent that any transverse component of displacement during the exposure is small in relation to the period of the pattern being printed. The control system 18 additionally enables the wafer 14 to be longitudinally displaced with a speed that varies during the displacement according to a predetermined profile, as is also required during the exposure operation. The operation for arranging the parallelism and separation between the wafer 14 and mask 12 may be facilitated by additionally integrating a manual or automated means for producing a coarse-resolution longitudinal displacement of the wafer 14 with respect to the mask 12 (e.g. a stepper motor) into the mechanical positioning system 17.

Illuminating a grating pattern 13 of period 800 nm with a collimated beam 11 of wavelength 363.8 nm produces $0^{th}$ and $1^{st}$ diffraction orders which interfere to form a series of self-image planes in the transmitted light-field, whose separation, $S_{01}$ is given by $$S_{01}=\lambda/(\cos\theta_0-\cos\theta_1) \qquad \text{equ. (3)}$$

where $\theta_0$ and $\theta_1$ are the diffraction angles of the $0^{th}$ and $1^{st}$ orders respectively.

Figure 2:
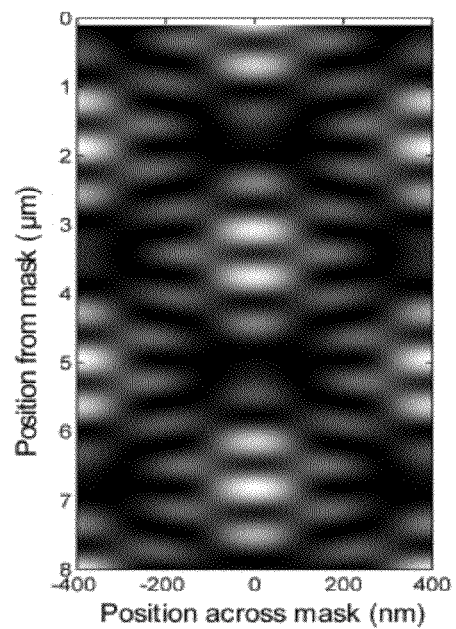
FIG. 2 shows a computer simulation of the light-field transmitted by the mask employed in the first embodiment.
Figure 3:
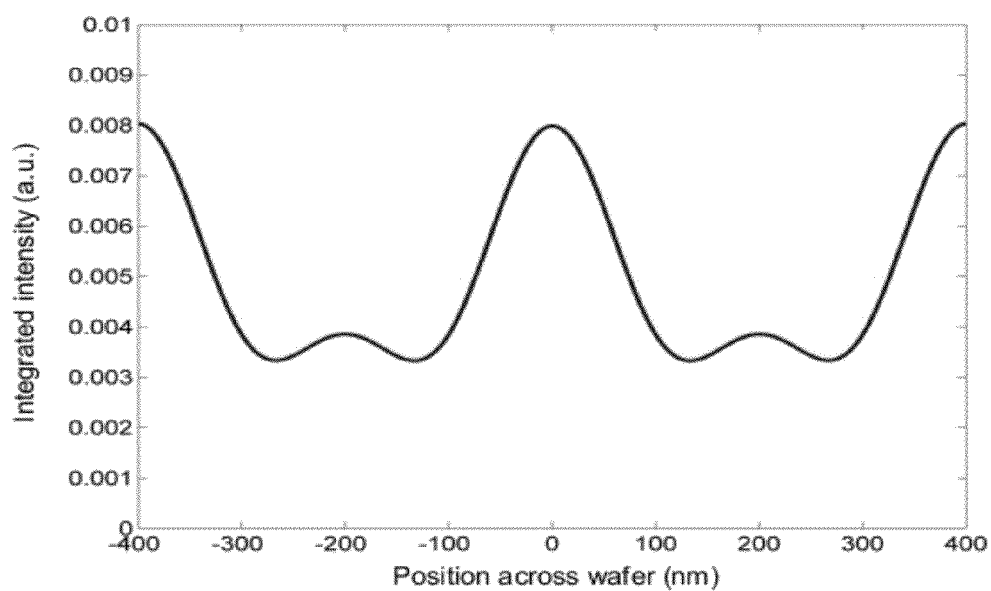
FIG. 3 shows the transversal variation of intensity in the time-averaged distribution printing the wafer, using the mask of the first embodiment and a DTL exposure according to the prior art.
Figure 4:
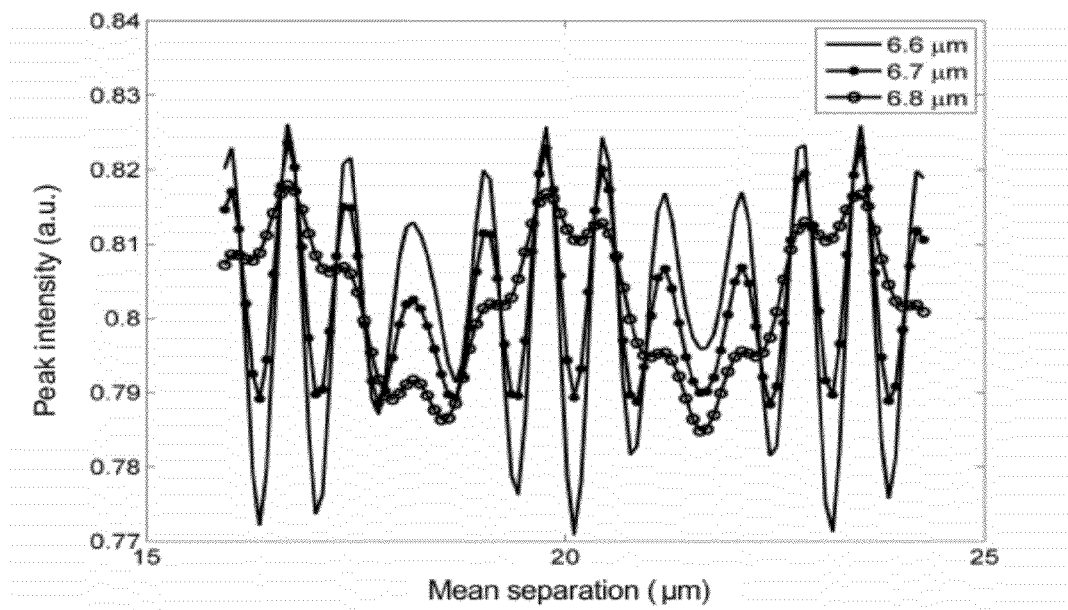
FIG. 4 shows the sensitivities of the peak intensity in the time-averaged distribution exposing the wafer to the mean separation of wafer and mask and to the displacement distance, using the mask of the first embodiment and a DTL exposure according to the prior art.
Figure 5:
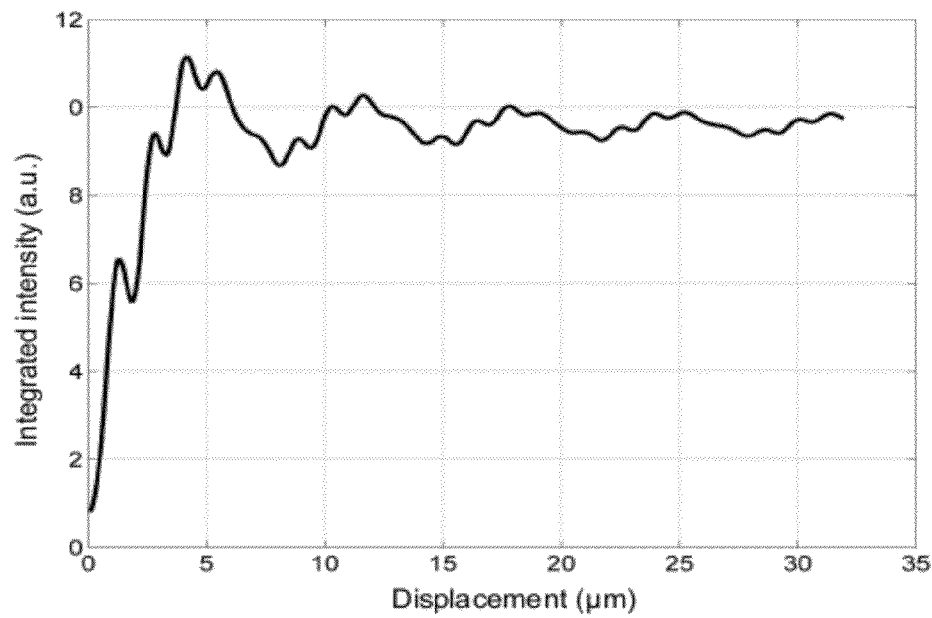
FIG. 5 shows the dependence of the time-averaged intensity on the displacement distance at a transversal position on the wafer corresponding to a peak in the integrated distribution, using the mask of the first embodiment and a DTL exposure according to the prior art.

Using equ. (3), $S_{01} \approx 3.3$ μm. However, due to the high diffraction angles of the $1^{st}$ and $2^{nd}$ order beams (~27° and ~66° respectively), the $2^{nd}$ diffraction orders are not accurately in phase with the 0th- and $1^{st}$-order beams in these planes, and so self-images of the mask pattern 13 are not accurately formed nor are they accurately located in distinct Talbot planes. As a result, if this mask pattern 13 were exposed at this illumination wavelength using the prior art technique of displacement Talbot lithography, it would be very difficult to print the pattern uniformly onto the wafer 14. The sensitivity of the line-width of the printed pattern to variation of the separation of the mask 12 and wafer 14 may be evaluated by computer simulation of the exposure process. Such computer simulation is preferably performed using standard theoretical methodologies, such as finite difference time domain (FTDT) or rigorous coupled wave analysis (RCWA), for calculating the propagation of electromagnetic waves through periodic micro-structures and through uniform media. Commercially or freely available software may be used, such as GSolver (in the case of RCWA, produced by the company Grating Solver Development Co.) or MEEP (in the case of FTDT, produced by Massachusetts Institute of Technology). The diffracted light-field transmitted by the mask pattern 13 employed in this embodiment illuminated at normal incidence by a beam 11 with wavelength 363.8 nm was simulated and the result is shown in FIG. 2, which shows a section of the light-field over a width of one period of the grating pattern 13 and extending up to a distance of 8 μm from the mask 12. As can be observed, at regular intervals of ~3.3 μm self-images of the pattern 13 in the mask 12 are formed, though the intensity distribution is not exactly periodic with increasing distance because of the changing relative phase of the $2^{nd}$-order beams at the self-image planes. The effect of applying the DTL method to this illuminated grating 13 may be determined by integrating the light-field over a range of distances corresponding to an integer multiple of the separation of successive self-image planes. With the wafer 14 at an initial distance of 20 μm from the mask 12 and the light-field integrated over a range of twice the Talbot distance (i.e. over 6.6 μm), the average intensity distribution that exposes the photoresist 15 is a periodic pattern of bright lines whose period is half that of the pattern in the mask, as is generally obtained when applying DTL to a one-dimensional mask pattern. The intensity variation across this distribution (in the direction orthogonal to the lines) is illustrated in FIG. 3, which shows the variation over a distance corresponding to one period of the mask pattern 13. In order that the pattern can be printed uniformly and reproducibly from the mask 12 onto the wafer 14 even if they are not accurately flat or parallel, it is necessary that the intensity of the peaks in the integrated distribution is not sensitive to the initial local separation of the wafer 14 and mask 12 or sensitive to deviations of the actual displacement of the wafer from the desired value. The dependencies of the peak intensity on the initial separation and on the displacement distance may be evaluated by computer simulation. The results of such an evaluation for the illuminated pattern concerned are presented in FIG. 4, which shows the magnitude of the intensity peak plotted as a function of the mean separation of the wafer 14 and mask 12 during the exposure for different displacement distances of the wafer 14. As can be seen, when the displacement distance is 6.6 μm (i.e. twice the Talbot distance), the peak intensity fluctuates strongly, up to ~7%, with varying mean separation, whereas with displacement distances of 6.7 and 6.8 μm, the intensity fluctuations are respectively 4.5% and 4%. The sensitivity of the printed pattern to the magnitude of the displacement may be further evaluated by determining the dependence of the integrated intensity on the displacement at a point whose transversal position corresponds to an intensity peak in the integrated distribution. FIG. 5 shows the result, from which can be seen that the integrated intensity reaches a maximum when the displacement is ~4 μm, continues to fluctuate strongly (by up to ±13%) with further increase in the displacement distance, and eventually reaches a reasonably stable value with displacements >30 μm. These results demonstrate the difficulty and limitations of applying the DTL technique to the pattern concerned if a high uniformity and high reproducibility of line-width are required across the printed pattern and from wafer to wafer.

In this embodiment of the invention, the wafer 14 is not displaced relative to the mask 12 at a constant speed during the exposure so that the range of intensity distributions between Talbot planes are uniformly recorded in the photoresist layer 15, but the speed of displacement is instead modulated during the displacement so that the exposure dose per incremental displacement, $E_G$, varies with the separation of the wafer 14 and mask 12, d, according to a truncated Gaussian distribution:

$$E_G(d)=E_0\exp\{-(d-d_0)^2/2\sigma^2\}, \text{ with } |d-d_0|\leq t\sigma \qquad \text{equ. (4)}$$

where $E_0$ is a constant, exp{ } represents the exponential function, $d_0$ is the mean separation during the displacement, σ is the standard deviation of the Gaussian distribution, t represents a truncation parameter of the Gaussian function, and |x| signifies the magnitude of x.

Using the apparatus of FIG. 1, this profile of incremental dose variation with changing separation may be achieved by programming the control system 18 so that the actuators displace the wafer 14 towards or away from the mask 12 during the exposure with a speed, $v_G$, that varies inversely with respect to the energy density variation described by equ. (4):

$$v_G(d)=k\exp\{(d-d_0)^2/2\sigma^2\}, \text{ with } |d-d_0|\leq t\sigma \qquad \text{equ. (5)}$$

where k is a constant.

The function describing the position required of each actuator as a function of time may be straightforwardly mathematically derived from equ. (5).

Figure 6:
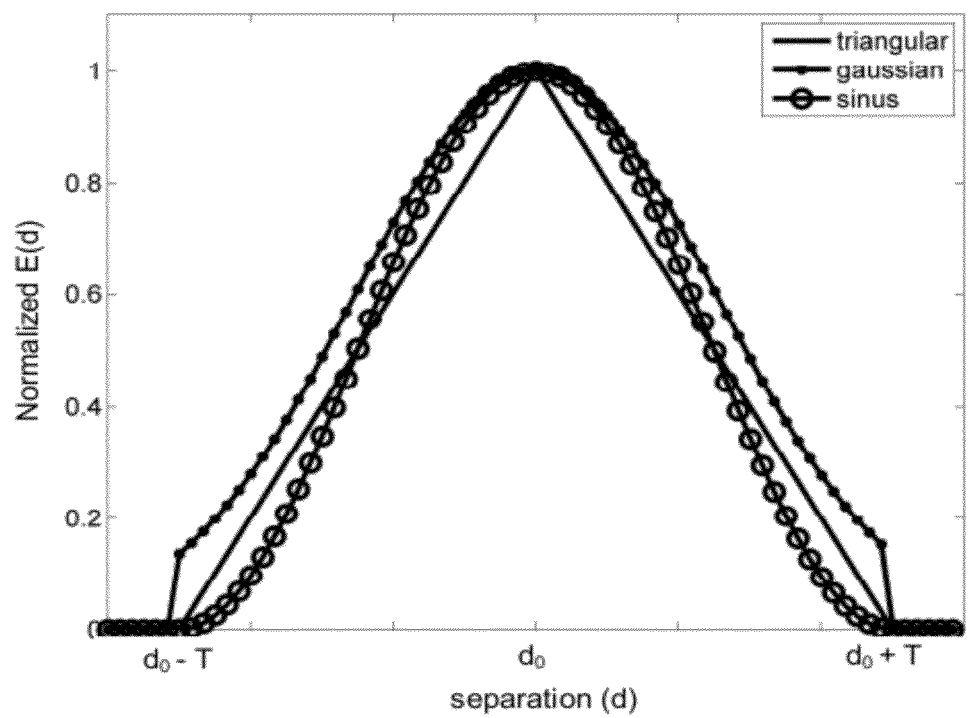
FIG. 6 shows the variations of the exposure energy density per incremental displacement with changing separation between the wafer and mask that are employed in different embodiments of the present invention.

To obtain a desirable exposure result, it is recommended that t≈2, for which $E_G(d)$ falls to ~13% of its maximum value at the extremities of the range of separation, though other values may be used depending on the requirements of the application. It is further recommended that σ be selected so that it corresponds substantially to half the separation of Talbot planes, though this value may also be adjusted according to the particular requirements of the application. With t=2 and σ=T/2, the resulting curve describing $E_G(d)$ is depicted in FIG. 6 (that indicated by "gaussian"). In order that the photoresist 15 is only exposed to the light-field transmitted by the mask 12 during the exposure defined by equ. (4) above, it is preferable that the opening and closing of the shutter 3 activated by the control system 18 at respectively the start and end of the exposure are synchronized with the displacement of the actuators. The constant, k, is simply a scaling factor which should be selected in combination with the intensity of the illuminating beam in order that the total exposure dose illuminating the layer of photoresist 15 produces a desired structure in the photoresist 15 following its development. The exposure dose is preferably optimized experimentally by printing a number of wafers with different doses and evaluating the printed results.

Figure 7:
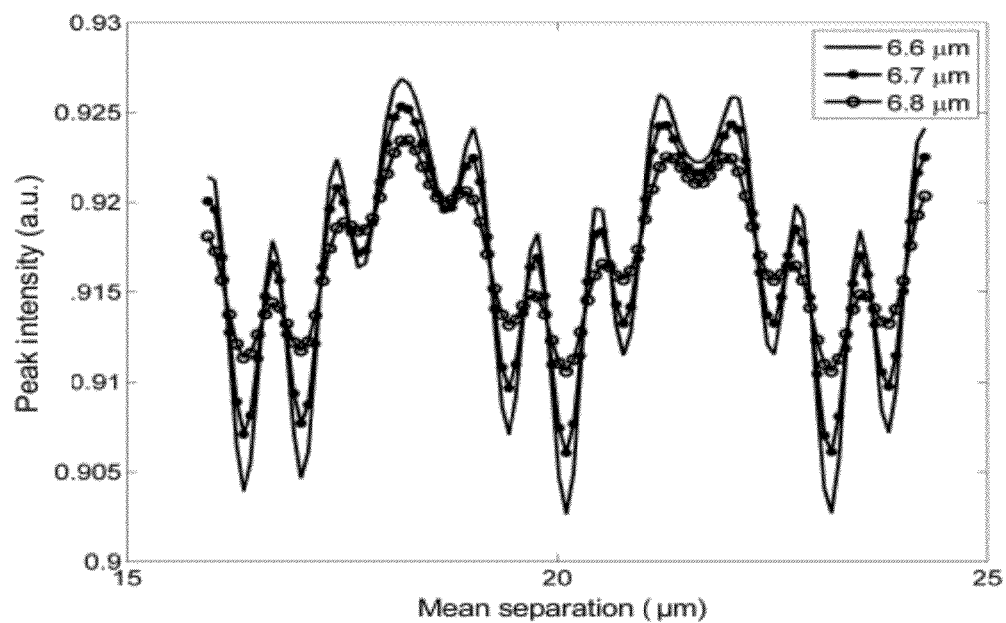
FIG. 7 shows the sensitivities of the peak intensity in the time-averaged distribution exposing the wafer to the mean separation and to the displacement distance, using the mask of the first embodiment and an exposure dose per incremental displacement that varies with changing separation according to a truncated Gaussian distribution.
Figure 8:
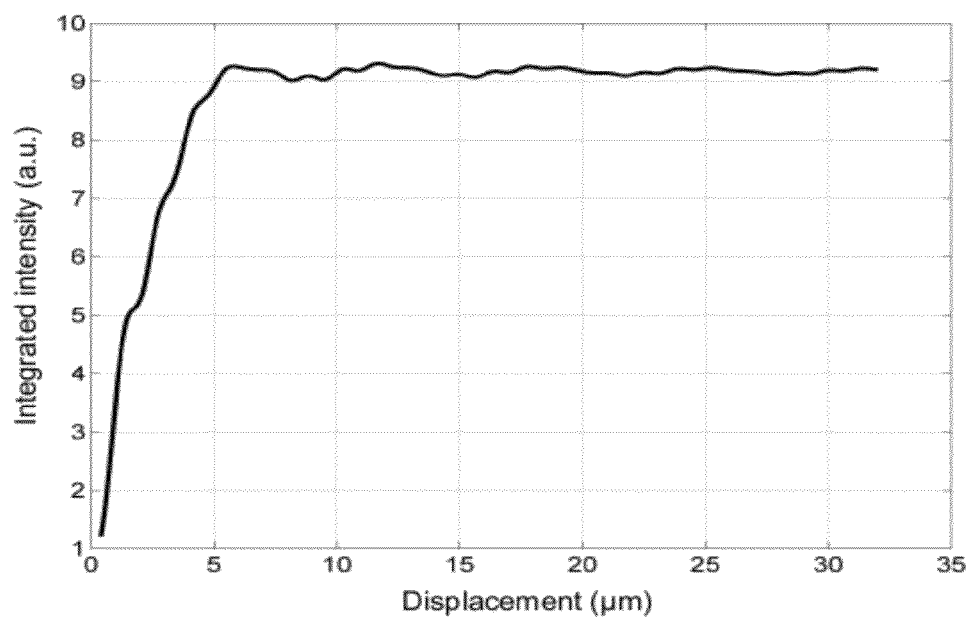
FIG. 8 shows the dependence of the time-averaged intensity on the displacement distance at a transversal position on the wafer corresponding to a peak in the integrated distribution, using the mask of the first embodiment and an exposure dose per incremental displacement that varies with changing separation according to a truncated Gaussian distribution.

The effect of displacing the wafer 14 during exposure with the variable speed described by equ. (5) on the average intensity distribution exposing the photoresist 15, in particular the effect on the dependence of the peak intensity of the distribution on the mean separation of the wafer 14 and mask 12 and on the dependence of the peak intensity on deviations of the actual displacement from the desired value, may be evaluated by computer simulation. The results of such simulations for the illuminated pattern concerned for mean separations between 15 and 25 µm, for σ=1.65, 1.675 and 1.7 µm and using t=2 so that the displacement distances of the wafer are respectively 6.6, 6.7 and 6.8 µm, are shown in FIG. 7. The fluctuations of the peak intensity with varying mean separation are thereby estimated to be ~2.5%, ~2% and ~1.5% respectively for the three values of displacement, so are significantly less than the corresponding values determined previously for a DTL exposure according to the prior art and has been verified experimentally. The sensitivity of the printed pattern to the magnitude of the displacement may be further evaluated by determining the dependence of the integrated intensity on the displacement at a point whose transversal position corresponds to an intensity peak in the integrated distribution. FIG. 8 shows the result, from which it can be seen that the average intensity during the exposure reaches a maximum at distance corresponding to approximately twice the Talbot distance (i.e. 6.6 µm) and oscillates with an amplitude <±1.5% with further increase in distance. These residual fluctuations may be reduced further, if required, by adjusting the parameters of the truncated Gaussian distribution. From these results, it is evident that exposing the mask with the exposure density per incremental displacement that varies with changing separation according to a truncated Gaussian distribution enables the pattern to be printed with much higher uniformity and reproducibility than can be obtained using DTL according to the prior art.

A significant improvement to the uniformity and reproducibility of the printed pattern may be obtained using the same apparatus of this embodiment but with the control system 18 programmed to modulate the speed of displacement of the actuators during the exposure so that the exposure dose per incremental displacement, $E_S$, varies with changing separation of the wafer 14 and mask 12, d, according to a truncated sinusoidal function:

$$E_S(d)=E_0 \cos^2\{\pi(d-d_0)/2L\}, \text{ with } |d-d_0|\leq tL \quad \text{equ. (6)}$$

where $d_0$ is the mean separation during the exposure, 2L is the period of the sinusoidal variation, and t defines the truncation of the sinusoidal distribution and therefore determines the full displacement of the wafer 14 during the exposure.

This profile of incremental dose variation with changing separation may be obtained by modulating the speed of displacement of the wafer, $v_S$, according to $$v_S(d)=k\sec^2\{\pi(d-d_0)/2L\}, \text{ with } |d-d_0|\leq tL \quad \text{equ. (7)}$$

where k is a constant.

It is recommended that L be selected to correspond to the Talbot distance, T, for the illuminated pattern, and that t be close to but less than 1, such as 0.9, in order to limit the maximum speed of displacement required of the actuators. With L=T and t=1, the form of the curve describing $E_S(d)$ is shown in FIG. 6 (that indicated by "sinus"). With these values the resulting variation of exposure dose per incremental displacement with increasing (or decreasing) separation of the wafer 14 approximates to the previous truncated Gaussian distribution. The control system 18 should preferably also automatically open and close the shutter 3 during the displacement of the actuators so that the photoresist is only exposed to the light-field transmitted by the mask during the required distance of displacement; and the scaling factor, k, should be selected in combination with the intensity of the illumination beam in order that the total exposure dose illuminating the photoresist 15 produces a desired structure in the photoresist 15 following its development. The exposure dose is preferably optimized experimentally by printing a number of wafers with different doses and evaluating the printed results.

Figure 9:
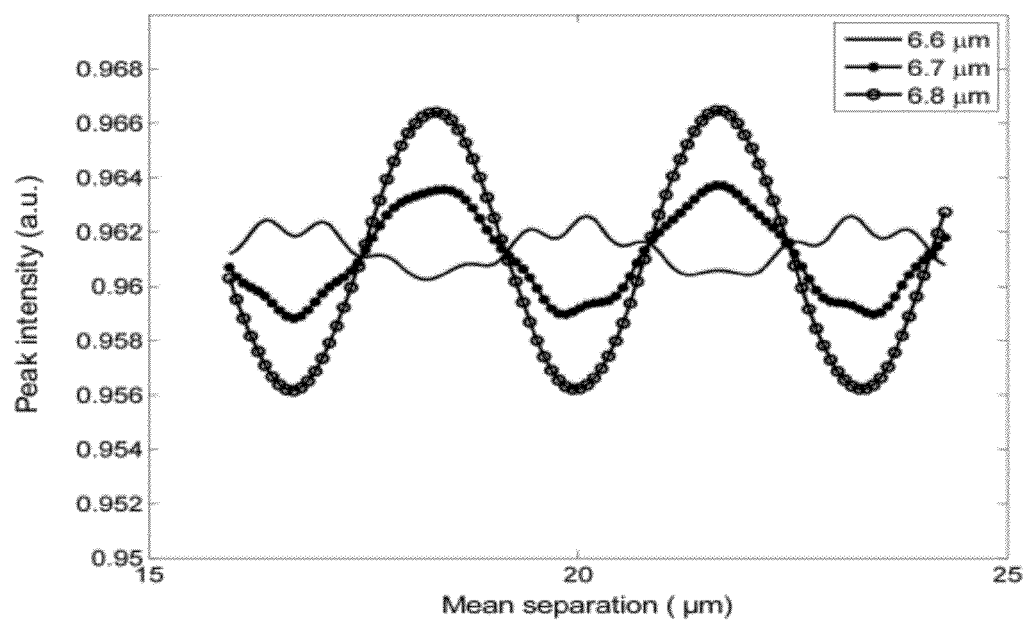
FIG. 9 shows the sensitivities of the peak intensity in the time-averaged distribution exposing the wafer to the mean separation and to the displacement distance, using the mask of the first embodiment and an exposure dose per incremental displacement that varies with changing separation according to a truncated sinusoidal distribution.
Figure 10:
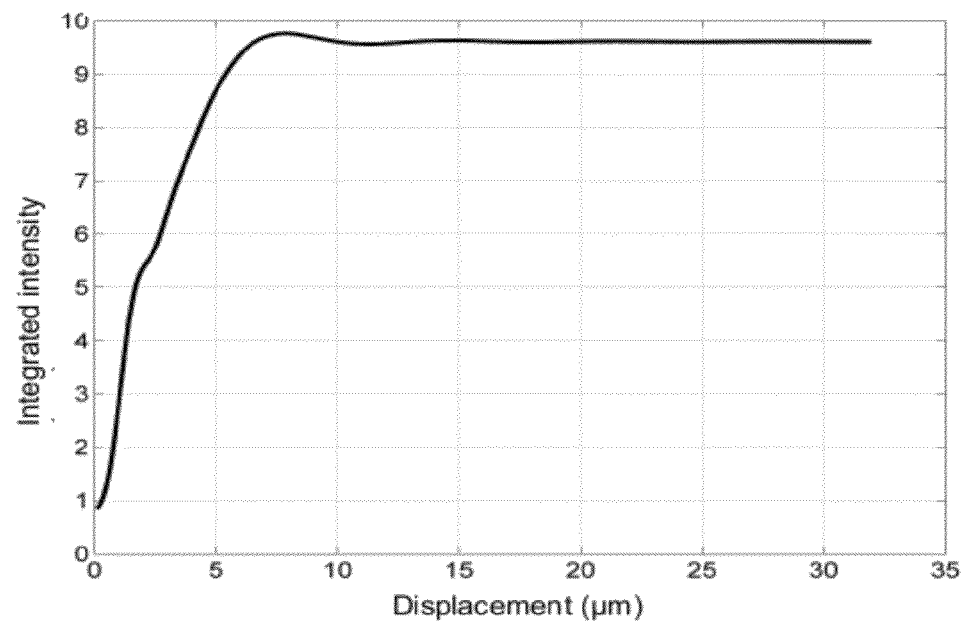
FIG. 10 shows dependence of the time-averaged intensity on the displacement distance at a transversal position on the wafer corresponding to a peak in the integrated distribution, using the mask of the first embodiment and an exposure dose per incremental displacement that varies with changing separation according to a truncated sinusoidal distribution.

Computer simulations are similarly performed to determine the sensitivities of the peak intensity in the integrated distribution exposing the photoresist 15 to variation in the mean separation of the wafer 14 and mask 12 and to deviations of the displacement distance of the wafer 14 from the optimum value. With L=3.3, 3.35 and 3.4 µm and t=1, so that the displacement distances of the wafer are respectively 6.6, 6.7 and 6.8 µm, the results for the mask pattern concerned are presented in FIG. 9. The fluctuations of the peak intensity are thereby estimated to be ~0.03, ~0.6 and ~1% respectively for the three values of displacement, so are significantly less than the corresponding values determined previously for a DTL exposure according to the prior art. The sensitivity of the printed pattern to the magnitude of the displacement may be further evaluated by determining the dependence of the integrated intensity on the displacement at a point whose transversal position corresponds to an intensity peak in the integrated distribution. FIG. 10 shows the result, from which can be seen that the average intensity reaches a maximum when the displacement is approximately twice the Talbot distance (i.e. 6.6 µm) and fluctuates with an amplitude <±1% with further increase in distance. From these results, it is evident that exposing the mask with the exposure density per incremental displacement that varies with changing separation according to a sinusoidal distribution enables the one-dimensional pattern to be printed with much higher uniformity and reproducibility than can be obtained using DTL according to the prior art.

A similar improvement in the uniformity and reproducibility of the printed pattern may be obtained by modulating the speed of displacement of the actuators during the exposure so that the exposure dose per incremental displacement, $E_T$, varies with changing separation, d, according to a truncated triangular function:

$$E_T(d)=E_0(L-|d-d_0|), \text{ with } |d-d_0|\leq tL \quad \text{equ. (8)}$$

where $d_0$ is the mean separation, 2L is the width of the (untruncated) triangular function, and t defines the truncation of the triangular function and therefore determines the displacement distance of the wafer 14 during the exposure.

This profile of incremental dose variation with changing separation may be obtained by modulating the speed of displacement of the wafer, $v_T$, according to $$v_T(d)=k/(L-|d-d_0|), \text{ with } |d-d_0|\leq tL \quad \text{equ. (9)}$$

where k is a constant.

It is recommended that L be selected to correspond to the Talbot distance, T, for the illuminated pattern, and that t be close to but less than 1, such as 0.9, in order to limit the maximum speed of displacement required of the actuators. With L=T and t=1, the form of the curve describing $E_S(d)$ is depicted in FIG. 6 (that indicated by "triangular"). With these values the resulting variation of exposure density per incremental displacement with increasing (or decreasing) separation again approximates to the previous truncated Gaussian distribution. The control system 18 should preferably also automatically open and close the shutter 3 during the displacement of the actuators so that the photoresist 15 is only exposed to the light-field transmitted by the mask 12 during the required range of displacement; and the scaling factor, k, should be selected in combination with the intensity of the illumination beam in order that the total exposure dose illuminating the photoresist 15 produces a desired structure in the photoresist 15 following its development. The exposure dose is preferably optimized experimentally by printing a number of wafers with different doses and evaluating the printed results.

Figure 11:
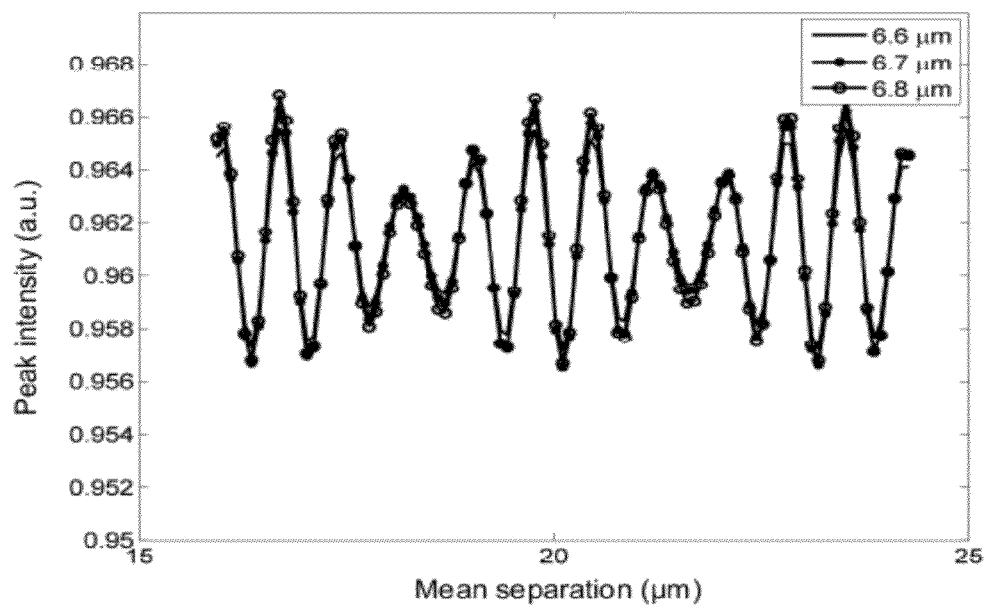
FIG. 11 shows the sensitivities of the peak intensity in the time-averaged distribution exposing the wafer to the mean separation and to the displacement distance, using the mask of the first embodiment and an exposure dose per incremental displacement that varies with changing separation according to a triangular distribution.
Figure 12:
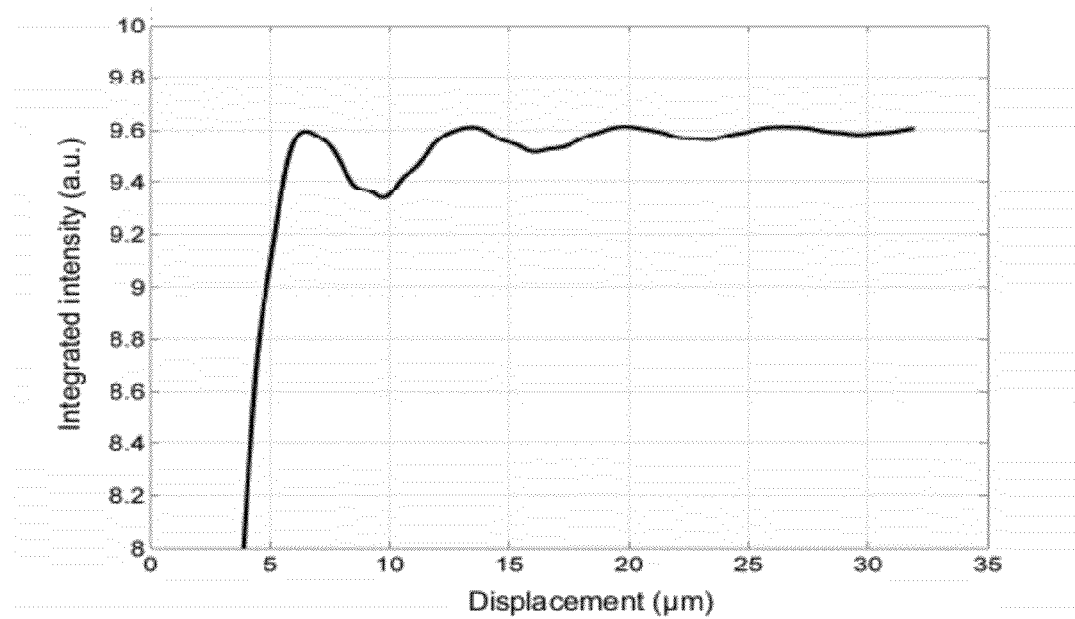
FIG. 12 shows the dependence of the time-averaged intensity on the displacement distance at a transversal position on the wafer corresponding to a peak in the integrated distribution, using the mask of the first embodiment and an exposure dose per incremental displacement that varies with changing separation according to a triangular distribution.

Computer simulations are similarly performed to evaluate the sensitivities of the peak intensity in the resulting integrated distribution exposing the photoresist 15 to variation in the mean separation of the wafer 14 and mask 12 and to deviations of the displacement distance of the wafer 14 from the desired value. With L=3.3, 3.35 and 3.4 μm and t=1, so that the displacements of the wafer are respectively 6.6, 6.7 and 6.8 μm, the results generated for the pattern concerned are presented in FIG. 11. The fluctuations of the peak intensity with varying mean separation are thereby estimated for all three values of displacement to be ~1%, so are significantly less than the corresponding values determined previously for a DTL exposure according to the prior art. The sensitivity of the printed pattern to the magnitude of the displacement may be further evaluated by determining the dependence of the integrated intensity on the displacement at a point whose transversal position corresponds to an intensity peak in the integrated distribution. FIG. 12 shows the result, from which can be seen that the average intensity reaches a maximum when the displacement is approximately twice the Talbot distance (i.e. 6.6 μm) and oscillates with an amplitude <±1% with further increase in distance. From these results, it is evident that exposing the mask with the exposure density per incremental displacement that varies with changing separation according to a truncated triangular distribution enables the one-dimensional pattern to be printed with much higher uniformity and reproducibility than may be achieved using DTL according to the prior art.

From FIG. 6 it can be seen that the truncated-Gaussian, truncated-sinusoidal and truncated-triangular variations of incremental energy density with changing separation described in this embodiment are similar: in each case the full width of the profile is approximately twice the Talbot distance, and the full width at half-maximum (FWHM) of the profile is approximately the Talbot distance. In all cases the incremental energy density changes in a substantially gradual manner over the displacement distance; and the minimum values at the initial and final values of the separation are >80% less than the maximum value. It should therefore be understood that similar improvements in the uniformity and reproducibility of the printed patterns may be obtained using profiles of incremental dose variation that have similar characteristics to those shown, such as a suitable trapezoidal distribution. Furthermore, theoretical and experimental results show that higher uniformity and reproducibility of the printed patterns are obtained by increasing the FWHM and full width from the values indicated in FIG. 6 (in relation to the Talbot distance for the periodic pattern concerned). A larger displacement of wafer 14 with respect to the mask 12 during the exposure requires, however, a greater precision in the orthogonality of the displacement of the wafer with respect to its plane (in order not to degrade the printing resolution) and also requires an actuator(s) with a larger travel range, so is not necessarily desirable.

Generally, for obtaining a very good uniformity and reproducibility of the printed results, the FWHM of the curve describing the variation of the exposure energy density per incremental change of separation over the displacement distance should be at least 0.8 times the Talbot distance, though smaller values, down to half the Talbot distance, may be alternatively used with the consequence of less uniform and less reproducible results; and the full width of the distribution should preferably be at least 0.8 times twice the Talbot distance though likewise smaller values, down to the Talbot distance, may be alternatively used to satisfy less demanding applications.

It is preferable, though not essential, that the curves describing the variation of energy density per incremental with change of separation are symmetric, or at least substantially so, about the separation at which the maximum value of energy density per incremental displacement occurs (as is the case for all the curves shown in FIG. 6). It is therefore preferable that the separation at which the maximum value of energy density per incremental displacement occurs is at the midpoint, or at least substantially so, between the initial and final values of the separations.

It is further most preferable that the values of energy density per incremental displacement at the initial and final values of the separation of the mask 12 and wafer 14 are at least 80% less than the maximum value of energy density per incremental displacement over the range of separation. Smaller variations of the energy density per incremental displacement over the displacement distance may, however, also be used but with the consequence of less uniform and less reproducible printed results (though still significantly better than the uniformity and reproducibility of the patterns printed using a DTL exposure according to the prior art).

Whereas, in the above embodiment the variation of speed of displacement of the wafer 14 with respect to the mask 12 is achieved by varying the speed of displacement of the wafer 14, in other embodiments of the invention the same effect and results may be achieved by equivalently varying the speed of displacement of the mask 12. In this case, a suitable mechanical system incorporating an actuator or actuators and an associated control system should be provided for longitudinally displacing the mask 12 with a variable speed during the exposure.

Exposing the mask with an energy density per incremental change of separation that varies over the displacement distance such that the incremental exposure densities at the edges of the range are small in relation to those at the centre of the range provides the additional benefit of reducing the synchronization accuracy required between the start and end of the exposure (defined, for example, by the opening and closing of a shutter) and the start and end, respectively, of the displacement. Using DTL according to the prior art, on the other hand, the energy density per incremental displacement at the two ends of the scan range are the same as at the centre, and so the printed pattern is much more sensitive to synchronisation errors between the exposure and displacement mechanisms.

Whereas in the embodiments described above the displacement of the wafer relative to the mask during the exposure is in a single direction over the required range with the required variation of speed, in other embodiments of the invention multiple displacements of the wafer over the range may be alternatively performed during the exposure, wherein each displacement conforms to the teaching described above, and preferably the direction of displacement is reversed between successive displacements. It is evident that a repetition of the same motion of displacement during the exposure will result in the same printed pattern on the wafer. By using a repetition of displacement over the scan range during the exposure, the sensitivity of the printed pattern to synchronization errors between the total time of the exposure defined by the illumination system and the total time during which the wafer is displacing is further reduced, so is advantageous.

In other embodiments of the invention using the same apparatus as employed in the first embodiment, or using an equivalent apparatus, the wafer is displaced relative to the mask by substantially the same final distance during the exposure, but using a stepping motion in which the wafer is displaced in a series of steps and with a varying delay time between steps. By selecting the step size to be small in relation to the final distance of displacement and by selecting the delay time to vary according the required variation of incremental exposure dose with changing separation, it will be appreciated that the integrated intensity distribution exposing the wafer approximates to that produced by the first embodiment, and so the printed results are substantially the same.

Figure 13:
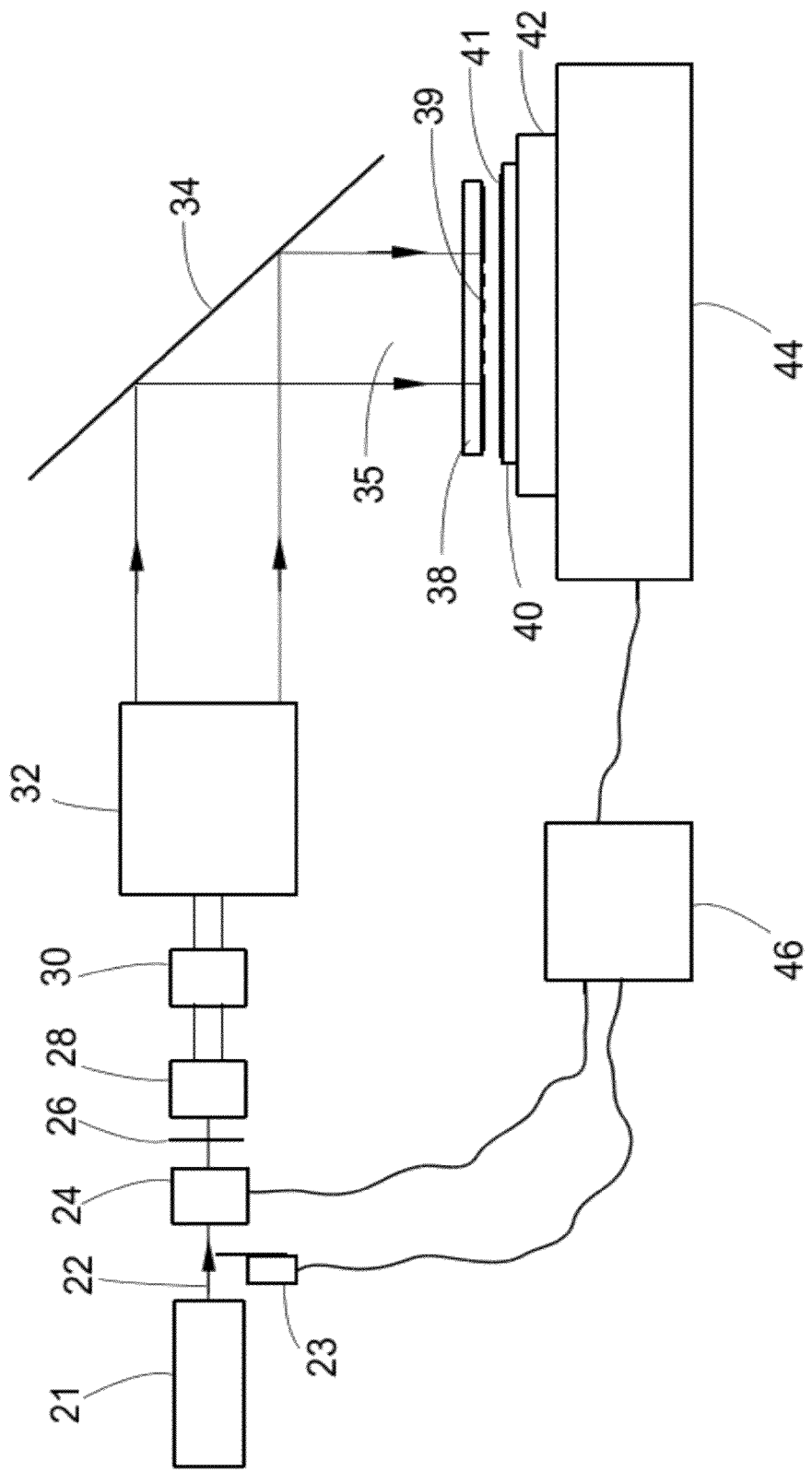
FIG. 13 is a schematic representation of a second embodiment of the invention for printing a periodic pattern onto a wafer in which the intensity of a beam illuminating the mask is varied during the longitudinal displacement of the wafer with respect to a mask.

With reference to FIG. 13, which shows a second exemplary embodiment of the invention, an argon-ion laser 21 emits a beam of substantially monochromatic light 22 with a wavelength 363.8 nm, a diameter ~2 mm, and which is in single transverse mode (so has a Gaussian intensity profile) and multiple longitudinal mode. The light is plane-polarized. After passing through an electronically operated shutter 23, the beam 22 is incident on a motorized variable attenuator 24 that is linked to a control system 46 that enables the intensity of the transmitted beam to be varied either continuously or in a stepped, quasi-continuous manner (i.e. digitized to, for example, 16 levels) during the exposure operation. Motorized variable attenuators are commercially available from such companies as Metrolux Optische Messtechnik GmbH (in particular, its range of Variable Dielectric Laser Beam Attenuators) and Del Mar Photonics Inc. (in particular, its range of Diffractive Variable Attenuators). The transmitted beam from the variable attenuator 24 is then incident on a quarter-wave plate 26 that produces a circularly polarized beam. The diameter of this beam is enlarged by a beam expander 28, which comprises a pair of lenses, so that the intensity profile of the resultant beam may be more easily converted, using a beam-transformer 30, from a Gaussian distribution into one that is substantially uniform across the central part of the beam. Suitable beam transformers are commercially available from, for example, Moltech GmbH (in particular, their piShaper product range). The output beam of the beam transformer 30 passes through a second beam-expander 32 that forms a collimated beam whose central, uniform part has a diameter larger than the size of the pattern to be printed. This beam is reflected by a mirror 34 to a mask 38 so that a pattern 39 in the mask 38 is uniformly illuminated by collimated beam 35 at normal incidence. On the underside surface of the mask is a two-dimensional periodic pattern of holes 39 in an opaque layer that are arranged on a hexagonal grid with a nearest-neighbour period of 520 nm. Whereas the figure only shows five holes in the mask pattern 13, it should be understood that many orders of magnitude more holes are present and that the mask pattern 13 typically has dimensions measured in centimeters. The pattern 39 has been formed in a layer of chrome on a thick fused silica substrate using standard electron-beam mask manufacturing technology. The mask 38 is rigidly mounted to a support frame (not shown in the diagram).

Below the mask 38 is a wafer 40 that has been spin-coated with a ~1 um-thick layer of a standard i-line-sensitive photoresist 41. The wafer 40 is mounted to a vacuum chuck 42 attached to a mechanical positioning system 44 incorporating actuators for positioning the wafer 40 substantially parallel and in proximity to the pattern 39 in the mask 38. The actuators preferably comprise 3 piezo-electric transducers (PZTs) each having an integrated strain gauge or capacitive sensor to enable closed-loop control of their respective displacements in order to minimize displacement errors caused by hysteresis and drifts, and preferably have a long travel range, such as 50 μm. The associated control system 46 for the actuators allows each to be either displaced independently or displaced in parallel with a constant speed. The actuators are configured to enable the wafer 40 to be tilted in orthogonal planes. Using also, for example, reference spacers of known and equal thickness that are introduced on different sides of the wafer 40, the wafer 40 is adjusted parallel and in proximity to the mask 38. The initial separation between the wafer 40 and mask 38 may be set typically to a value of 20 μm.

Figure 14:
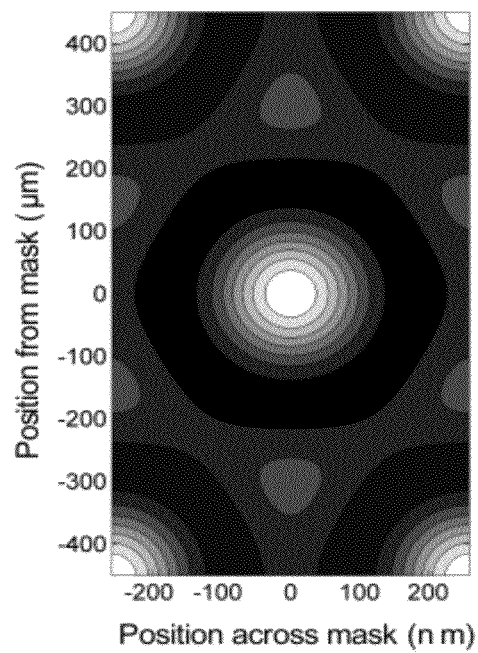
FIG. 14 shows the time-averaged intensity distribution exposing the wafer, using the mask of the second embodiment and a DTL exposure according to the prior art.
Figure 15:
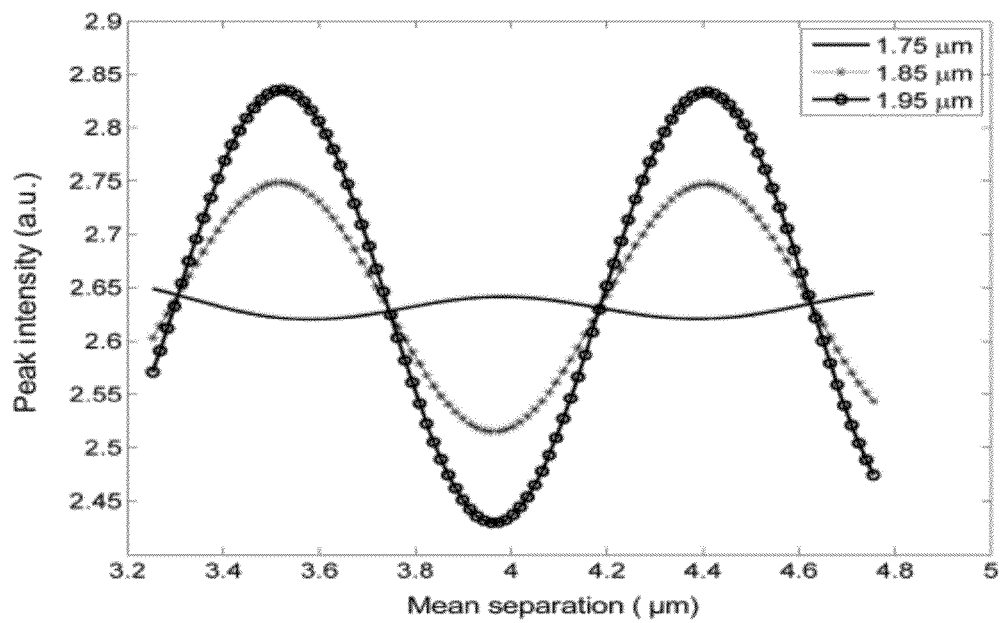
FIG. 15 shows the sensitivities of the peak intensity in the time-averaged distribution exposing the wafer to the mean separation of wafer and mask and to the displacement distance, using the mask of the second embodiment and a DTL exposure according to the prior art.
Figure 16:
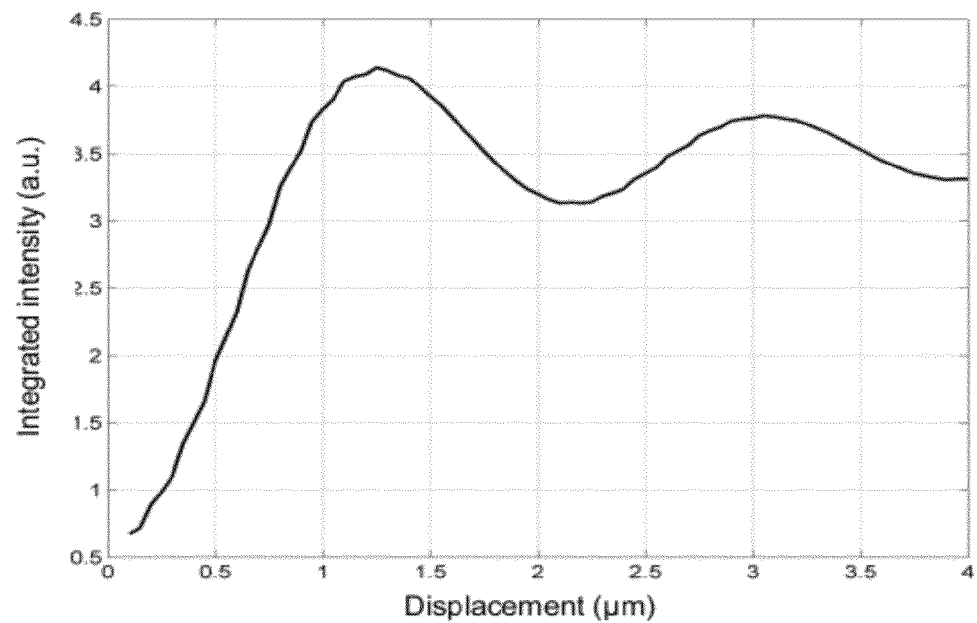
FIG. 16 shows the dependence of the time-averaged intensity on the displacement distance at a transversal position on the wafer corresponding to a peak in the integrated distribution, using the mask of the second embodiment and a DTL exposure according to the prior art.

Illumination of the hexagonal pattern of features 39 in the mask 38 with light of wavelength 363.8 nm produces a transmitted light-field composed of a $0^{th}$-order, undiffracted beam and six $1^{st}$ diffraction orders which interfere to form self-images separated by a Talbot distance of ~0.88 μm. Since there are no $2^{nd}$ or higher diffraction orders, the transmitted light-field is exactly periodic in the direction orthogonal to the mask (neglecting the edges of the pattern). Since the illuminating beam 35 is circularly polarized, the components of polarization in orthogonal planes are equal, thereby enabling a symmetric distribution of the diffraction orders and symmetric features in the self-images. The average intensity distribution that would be recorded from the mask 38 onto a photoresist-coated wafer 40 using the prior-art technique of DTL, by longitudinally displacing a wafer 40 through the light-field by a distance corresponding to an integer multiple of the separation of successive Talbot planes, may be determined by computer simulation. The result is illustrated in FIG. 14, which shows a unit cell of the hexagonal array of intensity peaks whose nearest-neighbour distance is the same as the pattern 39 in the mask 38. Since the light-field after the mask 38 is exactly periodic in the direction orthogonal to the mask, the intensity of the peaks in this distribution is independent of the mean separation of the wafer 40 and mask 38 during the DTL exposure. If, on the other hand, the displacement distance is not exactly an integer multiple of the separation between Talbot planes (because of, for example, mechanical hysteresis) then the peak intensity is no longer insensitive to the mean separation. This dependence is evaluated by computer simulation for displacement distances of respectively 1.75, 1.85 and 1.95 μm, and the results are shown in FIG. 15. From the results, when the displacement is ~0.01 μm from twice the Talbot distance, the fluctuation of peak intensity with varying mean separation is <1%, but for displacements that are only 0.09 μm and 0.19 μm from twice the Talbot distance, the peak intensities fluctuate by ~9% and ~16% respectively with varying mean separation, which would be unacceptably large for some applications. The sensitivity of the printed pattern to the magnitude of the displacement may be further evaluated by determining the dependence of the integrated intensity on the displacement at a point whose transversal position corresponds to an intensity peak in the integrated distribution. FIG. 16 shows the result, from which can be seen that the integrated intensity reaches a maximum when the displacement is ~1.25 μm and continues to fluctuate strongly (by ~±14%) with further increase in the displacement distance.

Figure 17:
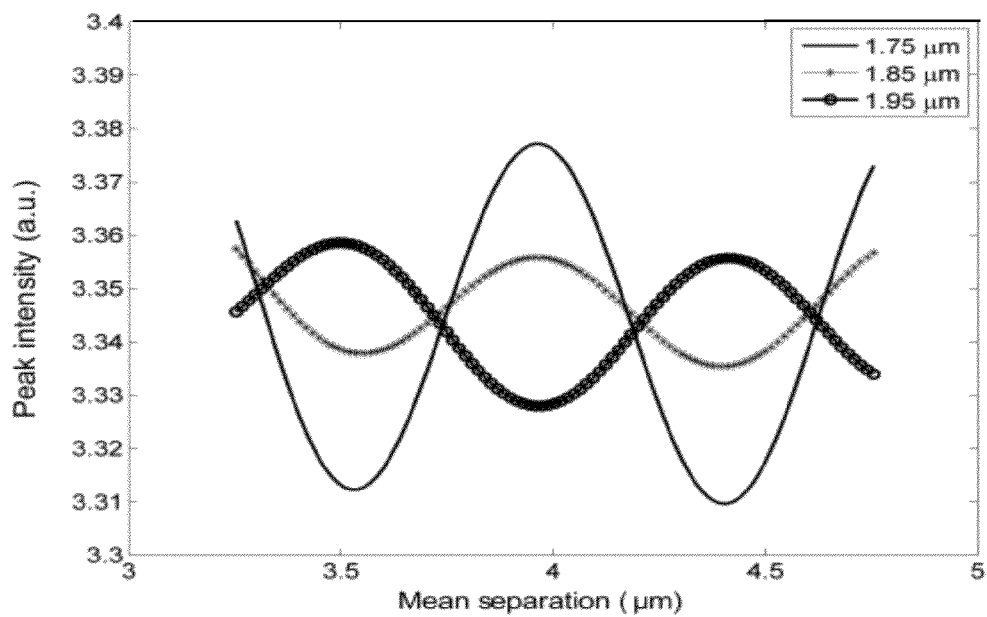
FIG. 17 shows the sensitivities of the peak intensity in the time-averaged exposing the wafer to the mean separation and to the displacement distance, using the mask of the second embodiment and an exposure dose per incremental displacement that varies with changing separation according to a truncated Gaussian distribution.
Figure 18:
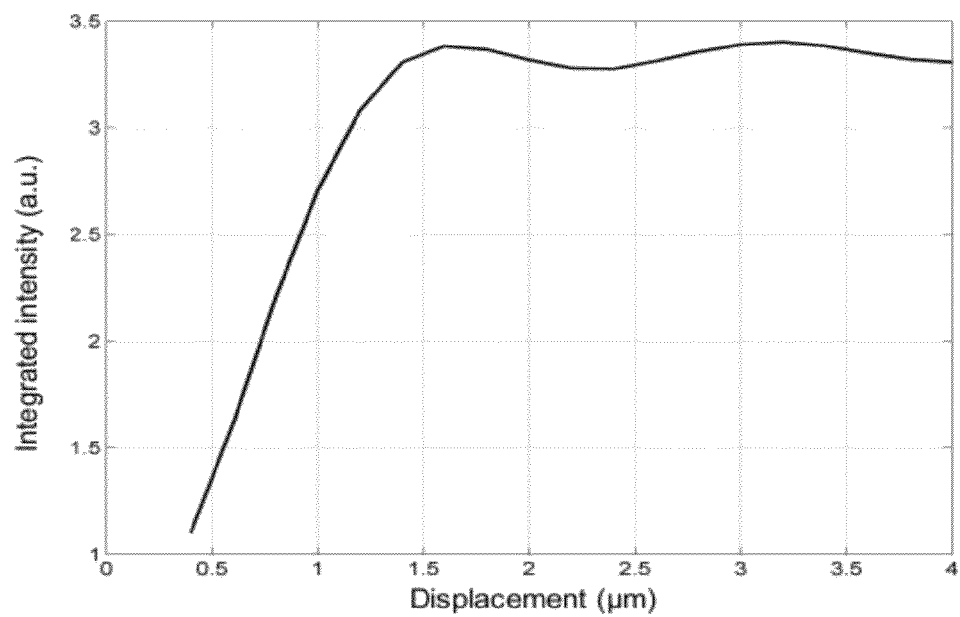
FIG. 18 shows the dependence of the time-averaged intensity on the displacement distance at a transversal position on the wafer corresponding to a peak in the integrated distribution, using the mask of the second embodiment and an exposure dose per incremental displacement that varies with changing separation according to a truncated Gaussian distribution.

In this second embodiment of the invention, the wafer 40 is longitudinally displaced relative to the mask 38 at a constant speed during the exposure in a manner according to the prior-art teaching of DTL. However, in contrast to that prior art, the intensity of the illuminating beam 35 is not constant during the exposure so as to record an average of the transversal intensity distributions between Talbot planes, but is instead varied so that the energy density of the illumination per incremental change of separation between the wafer 40 and mask 38 varies across the range of separation. The intensity of the beam 35 during the displacement of the wafer 40 is regulated by the control system 46 which adjusts the transmission of variable attenuator 24 according to a pre-programmed function representing the desired variation of energy density per incremental change of separation across the range of separation. The control system 46 preferably also opens and closes the shutter 23 at respectively the start and end of the exposure to ensure that the photoresist 41 is not otherwise exposed. Preferably, the function corresponds substantially to a truncated Gaussian distribution, as described by equ. (4). As in the first embodiment, it is recommended that the value assigned to the standard deviation of this function, $\sigma$, be half the separation of the Talbot planes, T, in the transmitted light-field, and that the maximum displacement of the wafer 40 during the exposure be set to twice the Talbot distance (i.e. $t=2$), although other values may also be employed depending on the specific requirements of the application concerned. With $\sigma=T/2$ and $t=2$, the variation of exposure dose per incremental change of separation over the displacement distance is described by the "gaussian" curve in FIG. 6. With the wafer 40 exposed to a Gaussian distribution of energy density per incremental change of separation between the mask 38 and wafer 40, the sensitivity of the peak intensity in the integrated distribution to variation in the mean separation during the exposure and to deviations of the displacement distance of the wafer from the desired value may be evaluated by computer simulations. With $\sigma=0.4375$, $0.4625$ and $0.4875$ μm and $t=2$ so that the displacements of the wafer are respectively 1.75, 1.85 and 1.95 μm, the results generated for the pattern concerned are shown in FIG. 17. The fluctuations of the peak intensity with varying mean separation are thereby estimated for the three displacements to be ~2, ~0.6 and ~0.9% respectively, so are significantly less than the corresponding values determined previously for a DTL exposure according to the prior art. The sensitivity of the printed pattern to the magnitude of the displacement may be further evaluated by determining the dependence of the integrated intensity on the displacement at a point whose transversal position corresponds to an intensity peak in the integrated distribution. FIG. 18 shows the result, from which can be seen that the average intensity reaches a maximum when the displacement distance is approximately twice the Talbot distance (i.e. 1.8 μm) and fluctuates with an amplitude $<\pm 1.5\%$ with further increase in distance. These residual fluctuations may be reduced further, if required, by adjusting the parameters of the truncated Gaussian distribution. From these results, it is evident that exposing the mask with the exposure density per incremental displacement that varies with changing separation according to a truncated Gaussian distribution enables the pattern to be printed with significantly higher uniformity and reproducibility than can be achieved using DTL according to the prior art.

Figure 19:
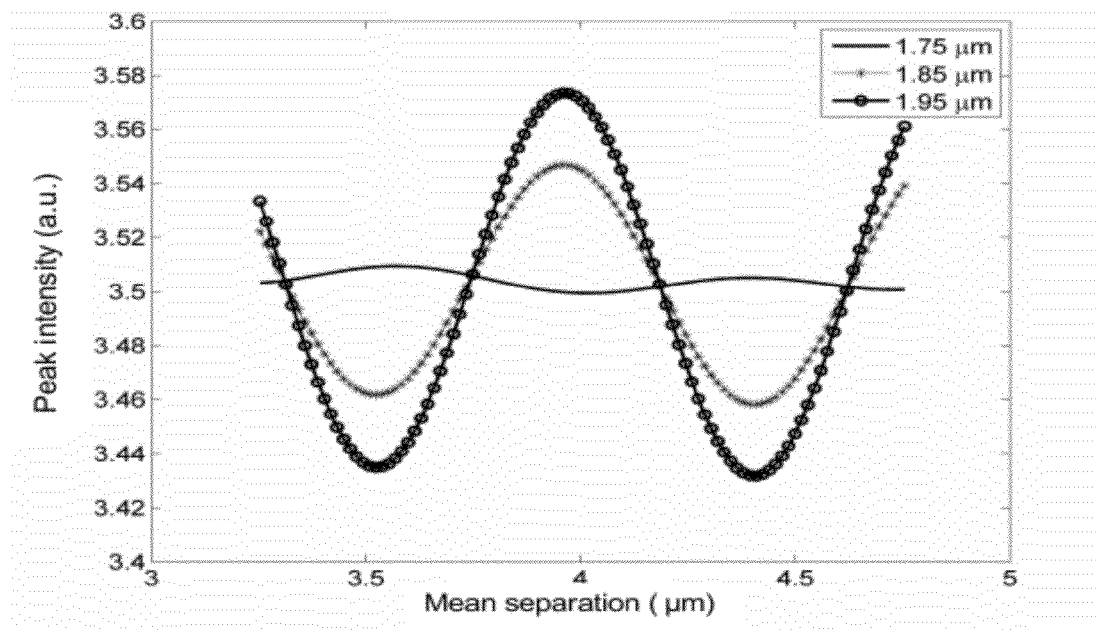
FIG. 19 shows the sensitivities of the peak intensity in the time-averaged distribution exposing the wafer to the mean separation and to the displacement distance, using the mask of the second embodiment and an exposure dose per incremental displacement that varies with changing separation according to a truncated sinusoidal distribution.
Figure 20:
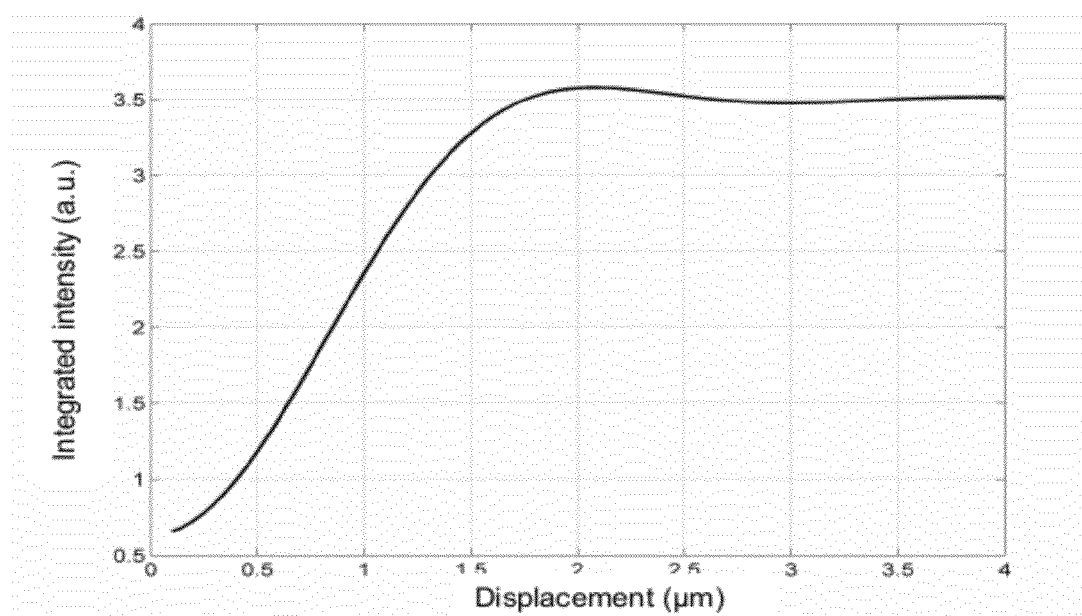
FIG. 20 shows the dependence of the time-averaged intensity on the displacement distance at a transversal position on the wafer corresponding to a peak in the integrated distribution, using the mask of the second embodiment and an exposure dose per incremental displacement that varies with changing separation according to a truncated sinusoidal distribution.

With the apparatus of this embodiment, other profiles of intensity variation of the illuminating beam during exposure may be alternatively employed with similarly beneficial results. For example, a truncated sinusoidal profile may be employed so that the variation of the resulting exposure energy density per incremental displacement of the wafer 40 over the displacement distance has a truncated sinusoidal distribution, as is described by equ. (6) for the first embodiment. As for that embodiment, it is recommended that the displacement distance of the wafer 40 during exposure corresponds to twice the separation of the Talbot planes in the transmitted light-field. With $L=T$ and $t=1$, the resulting variation of exposure dose per incremental change of separation over the displacement distance is described by the "sinus" curve in FIG. 6. Computer simulations are similarly performed to evaluate the sensitivities of the peak intensity in the resulting integrated distribution exposing the wafer 40 to variation in the mean separation of the wafer 40 and mask 38 and to deviations of the displacement distance of the wafer 40 from the desired value. With $L=0.875$, $0.925$ and $0.975$ μm and $t=1$ in equ. (6), so that the displacement distances of the wafer are respectively 1.75, 1.85 and 1.95 μm, the results generated for the mask pattern concerned are presented in FIG. 19. The fluctuations of the peak intensity with varying mean separation are thereby estimated to be ~0.3, ~2.5, and ~4% respectively for the three values of displacement, so are significantly less than the corresponding values previously determined for a DTL exposure according to the prior art. The sensitivity of the printed pattern to the magnitude of the displacement may be further evaluated by determining the dependence of the integrated intensity on the displacement at a point whose transversal position corresponds to an intensity peak in the integrated distribution. FIG. 20 shows the result, from which can be seen that the average intensity reaches a maximum when the displacement distance is approximately twice the Talbot distance (i.e. 1.8 μm) and fluctuates with an amplitude $<\pm 1.5\%$ with further increase in distance. From these results, it is evident that exposing the mask with an exposure density per incremental displacement that varies with changing separation according to a sinusoidal distribution enables the pattern to be printed with considerably higher uniformity and reproducibility than can be obtained using DTL according to the prior art.

Figure 21:
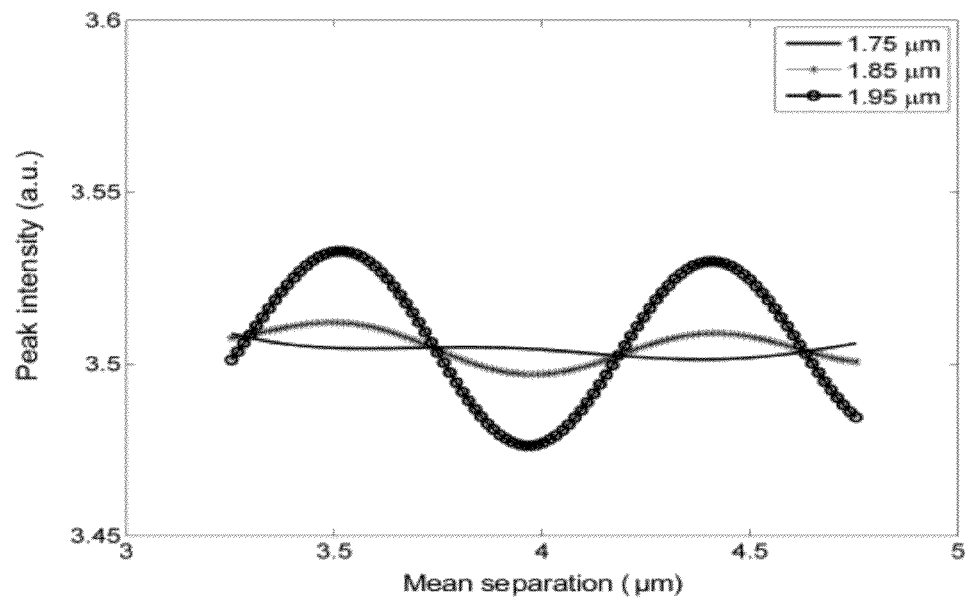
FIG. 21 shows the sensitivities of the peak intensity in the time-averaged distribution exposing the wafer to the mean separation and to the displacement distance, using the mask of the second embodiment and an exposure dose per incremental displacement that varies with changing separation according to a triangular distribution.
Figure 22:
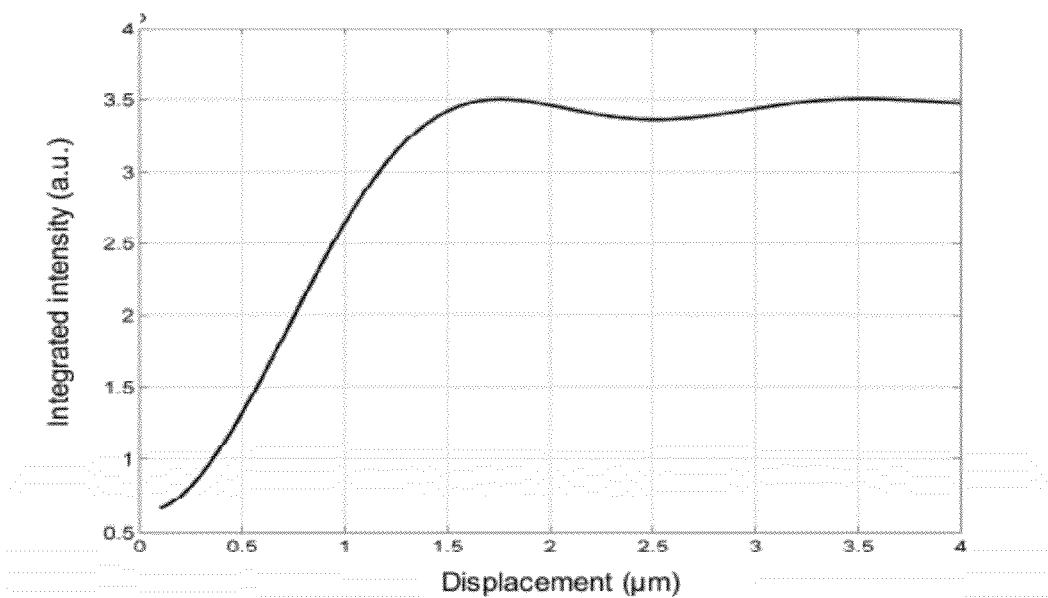
FIG. 22 shows the dependence of the time-averaged intensity on the displacement distance at a transversal position on the wafer corresponding to a peak in the integrated distribution, using the mask of the second embodiment and an exposure dose per incremental displacement that varies with changing separation according to a triangular distribution.

Another profile of intensity variation that may be used is a triangular variation, so that the resulting exposure energy density per incremental displacement of the wafer 40 over the displacement distance has a triangular distribution, as is described by equ. (8) for the first embodiment. As for that embodiment, it is recommended that the maximum displacement of the wafer 40 during exposure corresponds to twice the separation of the Talbot planes in the transmitted light-field. With $L=T$ and $t=1$, the resulting variation of exposure dose per incremental change of separation over the displacement distance is described by the "triangular" curve in FIG. 6. Computer simulations are similarly performed to evaluate the sensitivities of the peak intensity in the resulting integrated distribution exposing the wafer 40 to variation in the mean separation of the wafer 40 and mask 38 and to deviations of the displacement distance of the wafer 40 from the desired value. With $L=0.875$, $0.925$ and $0.975$ μm and $t=1$ in equ. (8), so that the displacement distances of the wafer are respectively 1.75, 1.85 and 1.95 μm, the results generated for the mask pattern concerned are presented in FIG. 21. The fluctuations of the peak intensity with varying mean separation are thereby estimated to be ~0.3, ~0.6, and ~1.7% respectively for the three values of displacement, so are substantially less than the corresponding values previously determined for a DTL exposure according to the prior art. The sensitivity of the printed pattern to the magnitude of the displacement may be further evaluated by determining the dependence of the integrated intensity on the displacement at a point whose transversal position corresponds to an intensity peak in the integrated distribution. FIG. 22 shows the result, from which can be seen that the intensity reaches a maximum when the displacement distance is approximately twice the Talbot distance (i.e. 1.8 µm) and fluctuates with an amplitude <±1.5% with further increase in distance. From these results, it is evident that exposing the mask with an exposure density per incremental displacement that varies with changing separation according to a triangular distribution enables the pattern to be printed with substantially higher uniformity and reproducibility than can be obtained using DTL according to the prior art.

From FIG. 6 it can be seen that the truncated-Gaussian, truncated-sinusoidal and truncated-triangular variations of incremental energy density with changing separation described in this embodiment are similar: in each case the full width of the profile is approximately twice the Talbot distance, and the full width at half-maximum (FWHM) of the profile is approximately the Talbot distance. In all cases the incremental energy density changes in a substantially gradual manner over the displacement distance; and the minimum values at the initial and final values of the separation are >80% less than the maximum value. It should therefore be understood that similar improvements in the uniformity and reproducibility of the printed patterns may be obtained using profiles of incremental dose variation that have similar characteristics to those shown, such as a suitable trapezoidal distribution. Furthermore, theoretical and experimental results show that higher uniformity and reproducibility of the printed patterns are obtained by increasing the FWHM and full width from the values indicated in FIG. 6 (in relation to the Talbot distance for the periodic pattern concerned). A larger displacement of wafer 40 with respect to the mask 38 during the exposure requires, however, a greater precision in the orthogonality of the displacement of the wafer with respect to its plane (so as not to degrade printing resolution) and requires an actuator(s) with larger travel range, so may not be desirable.

Generally, for obtaining a very good uniformity and reproducibility of the printed results, the FWHM of the curve describing the variation of the exposure energy density per incremental change of separation over the displacement distance should be at least 0.8 times the Talbot distance, though smaller values, down to half the Talbot distance, may be alternatively used with the consequence of less uniform and less reproducible results; and the full width of the distribution should preferably be at least 0.8 times twice the Talbot distance though likewise smaller values, down to the Talbot distance, may be alternatively used to satisfy less demanding applications.

It is preferable that the profiles describing the variation of energy density per incremental with change of separation are symmetric, or at least substantially so, about the separation at which the maximum value of energy density per incremental displacement occurs (as is the case for all the curves shown in FIG. 6). It is therefore preferable that the separation at which the maximum value of energy density per incremental displacement occurs is at the midpoint, or at least substantially so, between the initial and final values of the separations.

It is further most preferable that the values of energy density per incremental displacement at the initial and final values of the separation of the mask 38 and wafer 40 are at least 80% less than the maximum value of energy density per incremental displacement over the range of separation. Smaller variations of the energy density per incremental displacement over the displacement distance may, however, also be used but with the consequence of less uniform and less reproducible printed results (though still significantly better than the uniformity and reproducibility of the patterns printed using a DTL exposure according to the prior art).

In another embodiment of the invention, the separation between the wafer and mask is changed by double the distance illustrated in FIG. 6 (i.e. by ~four times the Talbot distance) and during the displacement the energy density per incremental displacement is varied according to the same truncated Gaussian/truncated sinusoidal/triangular profile shown in FIG. 6 (i.e. with a full width of ~twice the Talbot distance) but is varied twice, in sequence, during the exposure over the larger displacement distance; so it effectively corresponds to a double exposure of the same printed pattern but with a change of separation between the two exposures. Clearly, this exposure strategy may be extended to three or more such sequential exposures.

In the case that the mask contains a quasi-periodic pattern, that is a pattern whose period varies in a "slow" manner across the pattern area, such as a chirped grating, the variation of exposure energy density per incremental displacement employed for exposing the pattern should preferably be based on the largest period in the pattern.

For two-dimensional periodic patterns whose components have different periods along different axes (which may be referred to as "asymmetric" patterns), for example, an array of holes arranged on a rectangular grid with different periods in orthogonal directions, the light-field transmitted by the mask generally does not generate regular self-image planes, and so a regular Talbot distance cannot generally be defined (exceptions occur when the Talbot distance for one pattern component is a multiple of that for another). Even though, in general, self-image planes do not exist and a periodic pattern is not present in the longitudinal direction, the application of the DTL technique allow the creation of a 2D periodic pattern. However, due to the non-periodic variation of the diffraction pattern it may in general be difficult to achieve a stationary distribution without using a DTL range that is significantly larger than that one would need for the periods involved if they were present individually. For these cases, it is recommended that the profile of the energy density variation employed during the change of separation be determined by computer simulation of the integrated intensity distributions formed at the wafer under different exposure conditions for the particular mask pattern concerned. Generally, for a periodic, quasi-periodic or an asymmetric pattern, by employing an exposure energy density per incremental displacement that varies in a substantially gradual manner over the displacement distance and preferably by at least 50%, the pattern thereby printed in the recording layer has, in comparison with a pattern printed using DTL according to the prior art, considerably lower sensitivities to a deviation of the distance from the desired value and to the initial value of the separation.

Whereas in the first exemplary embodiment described above a one-dimensional periodic pattern is exposed using a variable speed of displacement of the wafer 40, and in the second exemplary embodiment a two-dimensional pattern is exposed using a variable intensity of illumination, it should, of course, be understood that the exposure strategy employed does not depend on the array type: the variable-speed-of-displacement scheme may equally well be applied to a two-dimensional pattern and the variable-intensity scheme may equally well be applied to a one-dimensional pattern.

Whereas the displacement of the wafer 40 with respect to the mask 38 in the second embodiment is achieved by displacing the wafer 40, it should be understood that the same effect and printed results may be achieved in other embodiments of the invention by alternatively longitudinally displacing the mask 38 during the exposure. For this purpose, a suitable mechanical system incorporating an actuator or actuators for displacing the mask 38 and an associated control system should be integrated in the apparatus.

In another embodiment of the invention the same (or equivalent) apparatus is employed as in the second embodiment but without the variable attenuator 24. As the wafer 40 displaces with a constant speed relative to the mask 38, the illumination system instead exposes the mask 38 to a series of "sub-exposures" at a constant sub-exposure frequency with a constant intensity per sub-exposure but with sub-exposure times that vary over the series of sub-exposures. It can be appreciated that by using a sufficiently high frequency of sub-exposures and using sub-exposure times that vary over the series according to the required variation of energy density per incremental change of separation over the displacement distance, then the effective exposure approximates to that described in the second embodiment, and so the printed results are substantially the same. The start and end times of each sub-exposure may be defined using the shutter 23 and control system 46 of the second embodiment. Substantially the same effect and printed results may also be achieved by using the same exposure time for each sub-exposure and varying either the intensity of the illumination or the frequency of the sub-exposures over the number of sub-exposures according to the required variation of energy density per incremental change of separation over the displacement distance. These variants are equivalent to the second embodiment in that if the intensity of the light is defined in terms of light flux per incremental time, where the time increment is the time between sub-exposures, then they produce the same variations of intensity with changing separation as produced by the apparatus of the second embodiment.

Whereas the laser source employed in the first and second exemplary embodiments is an argon laser operating at a particular wavelength of 363.8 that emits a continuous-wave (CW) beam, in other embodiments of the invention alternative laser sources may be used, such as solid-state lasers, laser diodes and excimer lasers, which emit beams at different wavelengths. Preferably, the output beam has a UV wavelength so that conventional UV-sensitive photoresists may be employed, though beams with wavelengths in other parts of the electromagnetic spectrum may be alternatively used. The laser may also deliver the light in pulses, preferably with a high frequency (e.g. $\geq$kHz) rather than be CW, as is generally the case for solid-state diode-pumped lasers. Further, other types of light source for generating a substantially monochromatic beam of light may be employed in other embodiments, for example, an arc lamp (e.g. mercury lamp) in combination with a filter to isolate the required spectral component and suitable optical elements for generating a well-collimated beam.

Whereas the first and second exemplary embodiments employ a refractive beam transformer for generating a beam with substantially uniform intensity from an output laser beam with a Gaussian profile, in other embodiments of the invention other means may be used for achieving a substantially uniform illumination of the mask. For example, if the laser beam has a Gaussian intensity profile, then it may be expanded and then scanned in a raster pattern across the mask so that the time-integrated energy density is rendered uniform over the pattern. Using such a scanning strategy, the separation of the mask and wafer would need to be changed repeatedly over the displacement distance whilst varying the energy density per incremental displacement during each change, and the frequency of the change of separation would need to be high in relation to that of the scan lines in the raster pattern so that each part of the mask pattern is exposed in substantially the same way.

Whereas the variation of intensity in the illuminating beam in the second embodiment is produced by a variable attenuator introduced in the beam path after the laser, in other embodiments of the invention, the variation of the beam's intensity may be achieved by other means, for example, by modulating the drive current of the laser source so that the power of the output beam from the source is varied.

In other embodiments of the invention an immersion fluid such water may be included in the gap between the substrate and mask in order to reduce the smallest period of the pattern that may be printed with the technique using a particular illumination wavelength.

While the embodiments described above may be considered as preferred embodiments of the invention, it should, of course, be understood that various modifications and changes in form or detail could readily be made without departing from the spirit of the invention. It is therefore intended that the invention should not be limited to the exact forms described and illustrated, but should be constructed to cover all modifications that may fall within the scope of the appended claims.

The invention claimed is:

1. A method for printing a pattern of features, including the steps of:
   a) providing a substrate having a recording layer disposed thereon;
   b) providing a mask bearing at least one of a periodic pattern of features and a quasi-periodic pattern of features;
   c) arranging the substrate substantially parallel to the mask and with a separation having an initial value;
   d) providing an illumination system for illuminating the mask with an intensity of substantially monochromatic light to generate a transmitted light-field for exposing the recording layer; and
   e) illuminating the mask for an exposure time whilst changing the separation by a distance having a desired value and with a rate of change of separation, wherein at least one of the rate of change of separation and the intensity of light is varied over the change of separation so that the mask is illuminated by an energy density per incremental change of separation that varies over said distance;
   whereby the pattern printed in the recording layer has low sensitivities to a deviation of the distance from the desired value and to the initial value of the separation.

2. A method according to claim 1, wherein the energy density per incremental change of separation over the distance is varied by at least 50% over the distance.

3. A method according to claim 1, wherein said transmitted light-field forms self-image planes separated by a Talbot distance, and the distance over which the energy density per incremental change of separation is varied is larger than the Talbot distance.

4. A method according to claim 1, wherein said transmitted light-field forms self-image planes separated by a Talbot distance, and the full-width at half-maximum of the variation of the energy density per incremental change of separation over the distance is larger than half the Talbot distance.

5. A method according to claim 1, wherein the variation of energy density per incremental change of separation over the distance corresponds substantially to one of a truncated Gaussian distribution, a truncated sinusoidal distribution and a triangular distribution.

6. A method according to claim 1, wherein the rate of change of separation is a speed that is varied over the change of separation.

7. A method according to claim 1, wherein the separation is changed in a series of steps and the rate of change of separation refers to a rate of stepping, which is varied over the change of separation.

8. A method according to claim 1, wherein the intensity of the light is varied continuously over the exposure time.

9. A method according to claim 1, wherein the intensity of the light is varied a plurality of times between an upper value and a lower value to form a series of sub-exposures at the higher value, and the times of the sub-exposures are varied over the change of separation.

10. A method according to claim 1, wherein the separation is changed a plurality of times over said distance during the exposure and at least one of the rate of change of separation and the intensity of light is varied during each of said changes of separation.

11. An apparatus for printing a pattern of features, which includes:
   a) a substrate having a recording layer disposed thereon;
   b) a mask bearing at least one of a periodic pattern of features and a quasi-periodic pattern of features;
   c) a means for arranging the substrate substantially parallel to the mask and with a separation having an initial value;
   d) an illumination system for illuminating the mask for an exposure time with an intensity of substantially monochromatic light to generate a transmitted light-field for exposing the recording layer;
   e) a means for changing the separation over a distance having a desired value and with a rate of change of separation during the illumination of the mask; and
   f) a means for varying at least one of the rate of change of separation and the intensity of light so that the mask is illuminated by an energy density per incremental change of separation that varies in a substantially gradual manner over the distance;
   whereby the pattern printed in the recording layer has low sensitivities to a deviation of the distance from the desired value and to the initial value of the separation.

12. An apparatus according to claim 11, wherein the varying means includes an actuator for changing the separation with a variable speed or in a series of steps with a time interval between steps that varies with the changing separation.

13. An apparatus according to claim 11, wherein the illumination system includes a light source that emits a beam with an output power and the varying means changes the power of said output beam.

14. An apparatus according to claim 11, wherein the illumination system includes a variable attenuator for changing the intensity of the light.

15. An apparatus according to claim 11, wherein at least one of the periodic and quasi-periodic patterns of features in the mask is formed in at least one of a layer of an opaque material and a layer of a phase shifting material on a transparent substrate.

16. An apparatus according to claim 11, wherein at least one of the periodic and quasi-periodic patterns of features is periodic in a plurality of directions.

17. An apparatus according to claim 11, wherein the periodic pattern in the mask has a first period and the mask bears at least one additional periodic pattern with a different period.

18. An apparatus according to claim 11, wherein the periodic pattern in the mask has a grating vector orientated in a first direction and the mask bears at least one additional periodic pattern with a grating vector orientated in a different direction.

19. An apparatus according to claim 11, wherein the illumination system produces a beam of light and includes a scanning system for scanning said beam across the mask.

* * * * *